United States Patent
Gerrits et al.

(10) Patent No.: US 6,905,073 B2
(45) Date of Patent: *Jun. 14, 2005

(54) ELECTRONIC CARD ASSEMBLY AND SHELL THEREFOR

(75) Inventors: Antonius H. J. Gerrits, Beek en Donk (NL); Wim Van Alst, St. Oedenrode (NL); Paulus J. Pigmans, Tilburg (NL); Paul J. M. Potters, EG Eindhoven (NL)

(73) Assignee: FCI Americas Technology, Inc., Reno, NV (US)

( * ) Notice: Subject to any disclaimer, the term of this patent is extended or adjusted under 35 U.S.C. 154(b) by 2 days.

This patent is subject to a terminal disclaimer.

(21) Appl. No.: 09/916,491

(22) Filed: Jul. 27, 2001

(65) Prior Publication Data

US 2002/0053599 A1 May 9, 2002

Related U.S. Application Data

(63) Continuation of application No. 09/297,776, filed as application No. PCT/US97/14369 on Aug. 13, 1997, now Pat. No. 6,533,177, and a continuation of application No. 08/748,503, filed on Nov. 8, 1996, now Pat. No. 6,058,018, said application No. PCT/US97/14369, filed on Aug. 13, 1997.
(60) Provisional application No. 60/047,398, filed on May 22, 1997.

(51) Int. Cl.[7] .............................................. G06K 19/00
(52) U.S. Cl. ..................................................... 235/487
(58) Field of Search ................................. 235/487, 486, 235/492; 73/811–812, 814, 847, 849, 788; 361/601, 737, 740

(56) References Cited

U.S. PATENT DOCUMENTS

| | | |
|---|---|---|
| 4,872,848 A | 10/1989 | Mouissie |
| 5,144,533 A | 9/1992 | Annett |
| 5,207,586 A | 5/1993 | MacGregor |
| 5,330,360 A | 7/1994 | Marsh et al. |
| 5,339,222 A | 8/1994 | Ramey et al. |
| 5,377,060 A | * 12/1994 | Nigam .................... 360/90.01 |
| 5,409,385 A | 4/1995 | Tan et al. |
| 5,463,531 A | 10/1995 | Choon et al. |
| 5,476,387 A | 12/1995 | Ramey et al. |
| 5,477,426 A | 12/1995 | Bethurum |
| 5,478,259 A | 12/1995 | Noschese |
| 5,493,477 A | 2/1996 | Hirai |
| 5,497,297 A | 3/1996 | Kilmer et al. |
| 5,502,892 A | 4/1996 | Lien |

(Continued)

FOREIGN PATENT DOCUMENTS

JP 4-63284 5/1992

OTHER PUBLICATIONS

Keizou Sakurai, Electronic Manufacturing Technology Symposium, 1995, [The basic processing parameters and reliability evaluation results for the new IC–Card packaging method by using transfer molding].*

Ed Marsh, IEEE Technical Applications Conference and Workshops Northcon95, Oct. 1995 [Packaging Guidelines for PC Cards].*

*Primary Examiner*—Diane I. Lee
(74) *Attorney, Agent, or Firm*—Woodcock Washburn LLP

(57) ABSTRACT

An electronic card and the shell for the electronic card capable of exceeding applicable bending, torque, and fingernail test specifications are disclosed. The electronic card assembly can resist a bend of greater than 10° during a torque test applying a torque of greater than approximately 1.2 N-m; deflects less than approximately 3.5 mm during a PCMCIA bend test applying a force of approximately 20N; and displaces less than approximately 1.5 mm during a fingernail test applying a force of more than approximately 100N. Such test performance is achieved even without a printed circuit board in the electronic card assembly.

8 Claims, 42 Drawing Sheets

U.S. PATENT DOCUMENTS

| | | |
|---|---|---|
| 5,529,503 A | 6/1996 | Kerklaan |
| 5,536,905 A | 7/1996 | Redman et al. |
| 5,548,483 A | 8/1996 | Feldman |
| 5,563,770 A | 10/1996 | Bethurum |
| 5,564,948 A | 10/1996 | Harting et al. |
| 5,567,884 A * | 10/1996 | Dickinson et al. ............ 73/810 |
| 5,574,628 A | 11/1996 | Persia et al. |
| 5,687,064 A | 11/1997 | Nichols |
| 5,689,405 A | 11/1997 | Bethurum |
| 5,736,646 A * | 4/1998 | Dickinson et al. ............ 73/814 |
| 5,754,404 A | 5/1998 | Biermann et al. |
| 5,768,110 A | 6/1998 | Frommer et al. |
| 5,833,473 A | 11/1998 | Betker et al. |
| 5,984,731 A | 11/1999 | Laity |
| 6,058,018 A | 5/2000 | Gerrits et al. |
| 6,116,962 A | 9/2000 | Laity |
| 6,160,711 A | 12/2000 | Gerrits et al. |

* cited by examiner

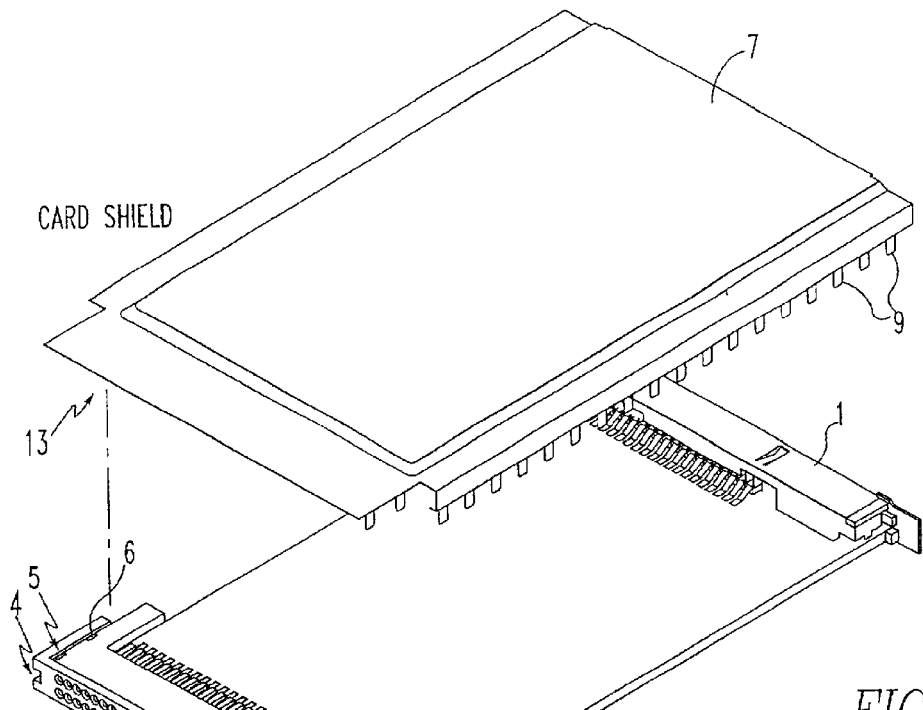
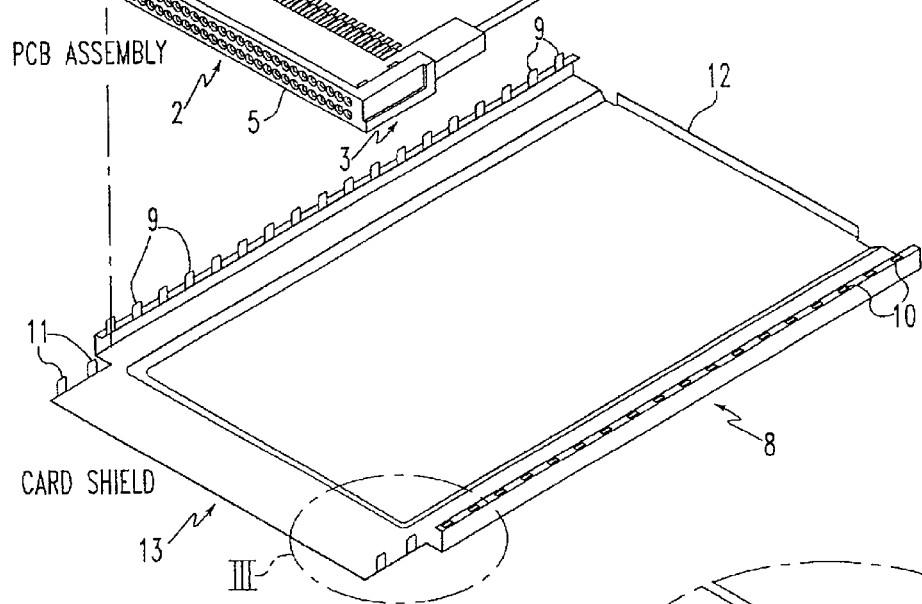
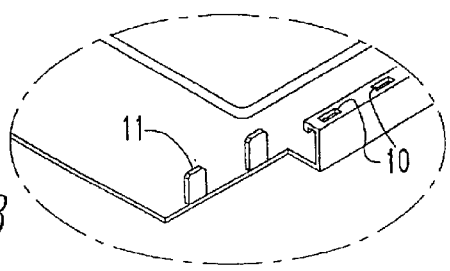

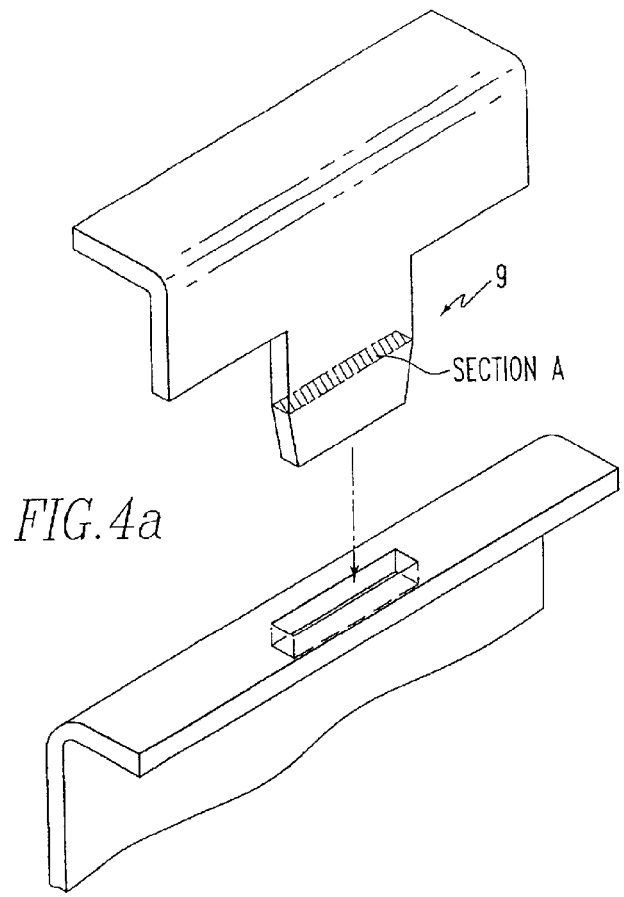
*FIG.4a*
 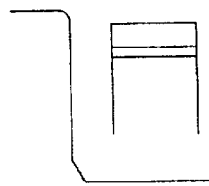 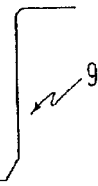 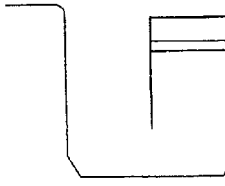
*FIG.4g*  *FIG.4b*  *FIG.4h*  *FIG.4c*
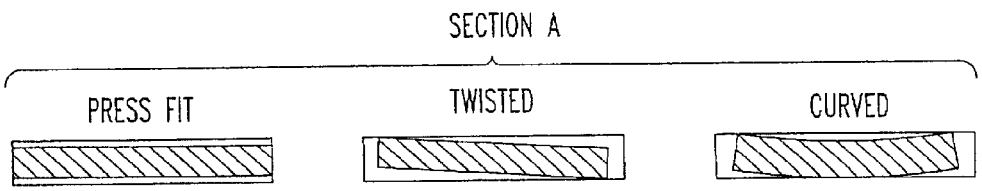
SECTION A
PRESS FIT    TWISTED    CURVED
*FIG.4d*  *FIG.4e*  *FIG.4f*

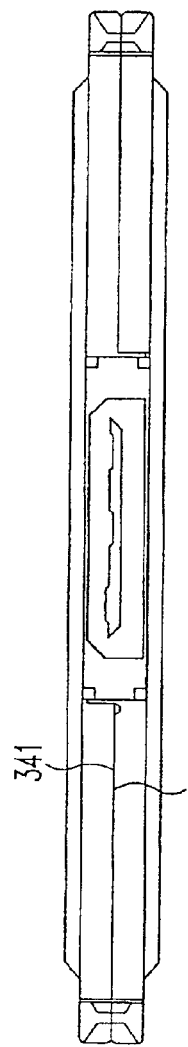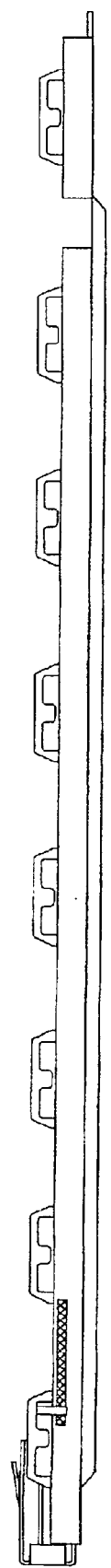
FIG. 24
FIG. 23

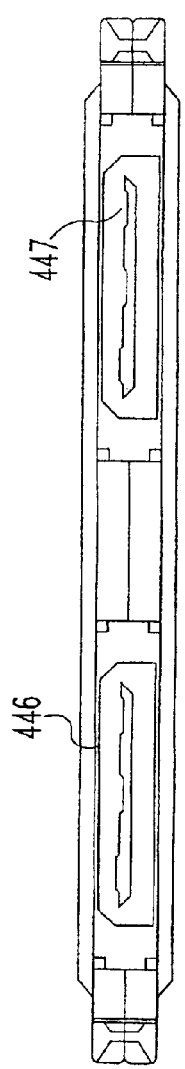
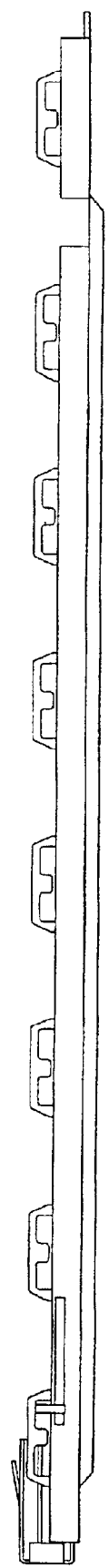

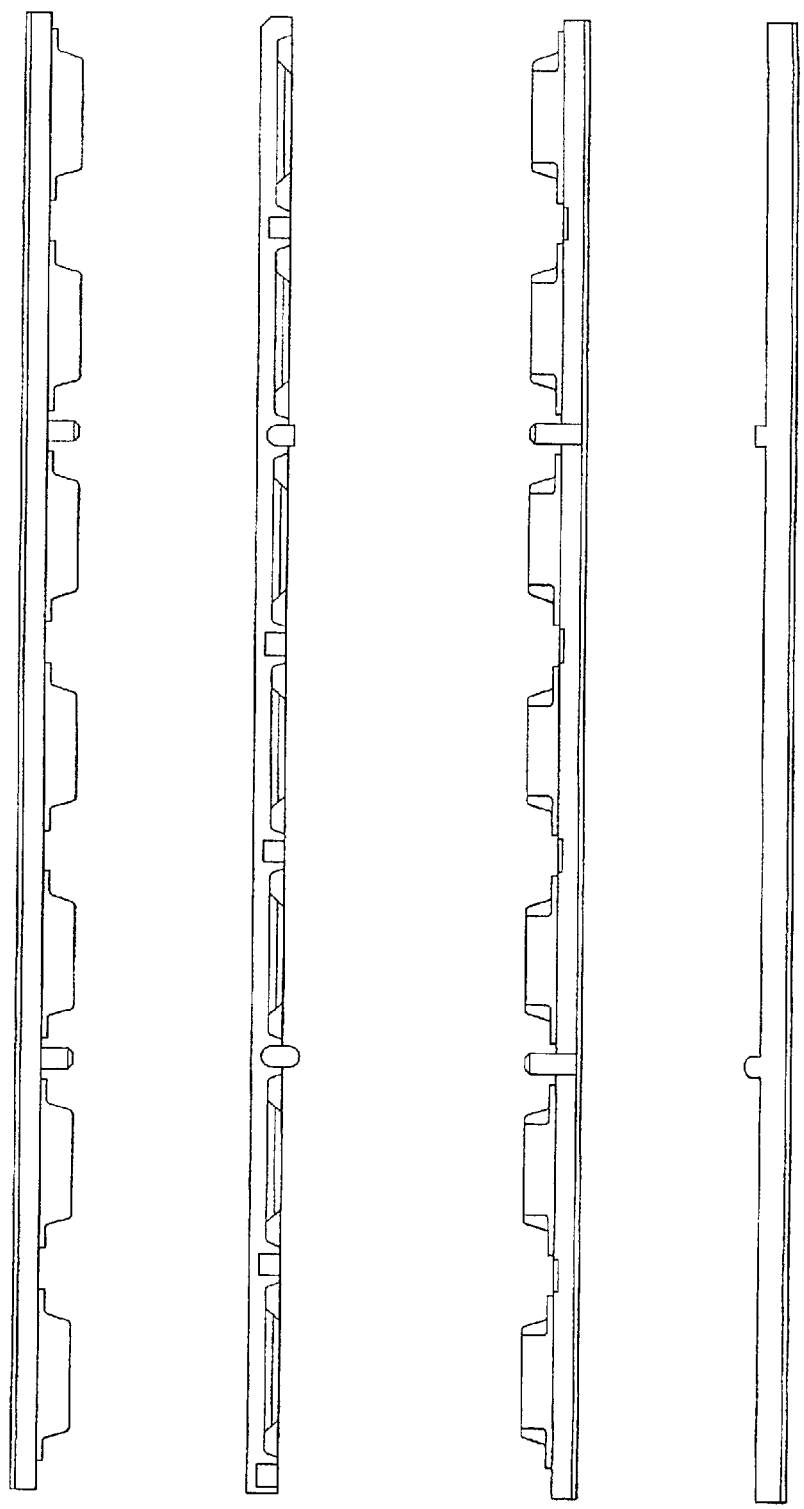
FIG.35

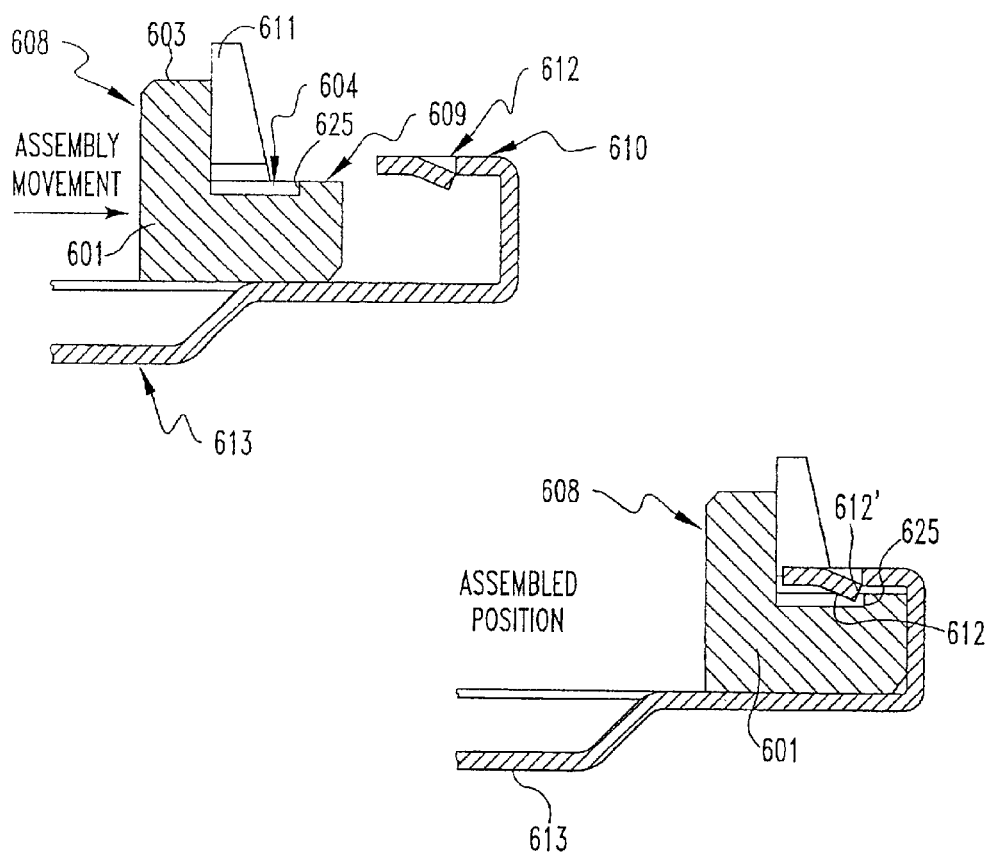
*FIG. 38*
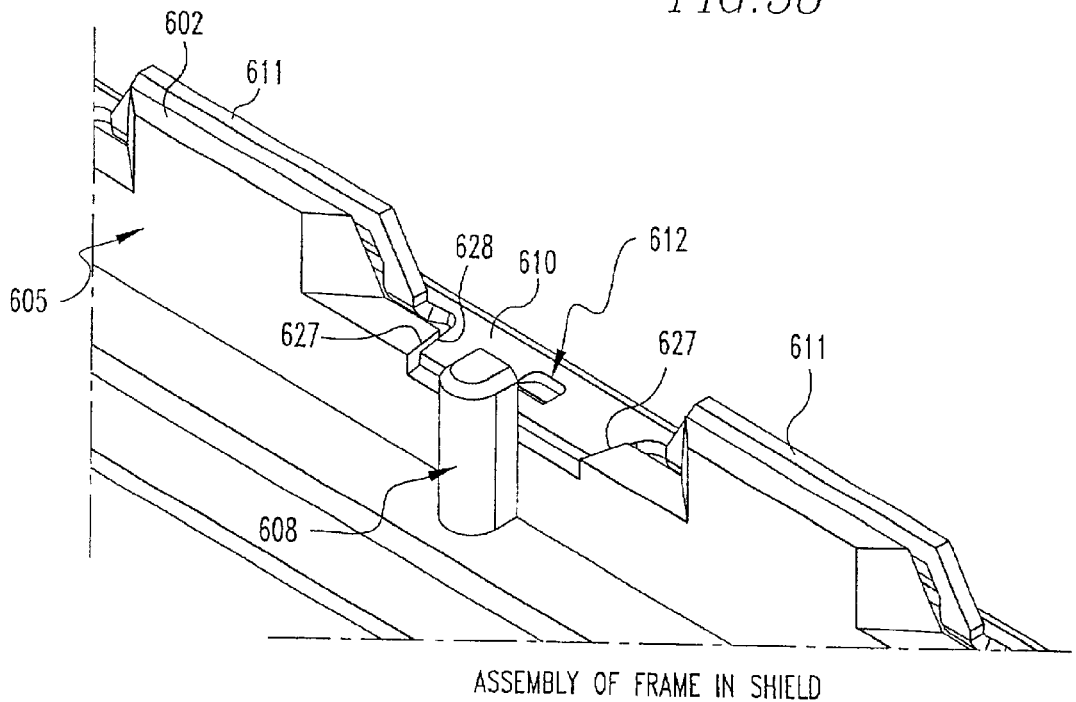
ASSEMBLY OF FRAME IN SHIELD

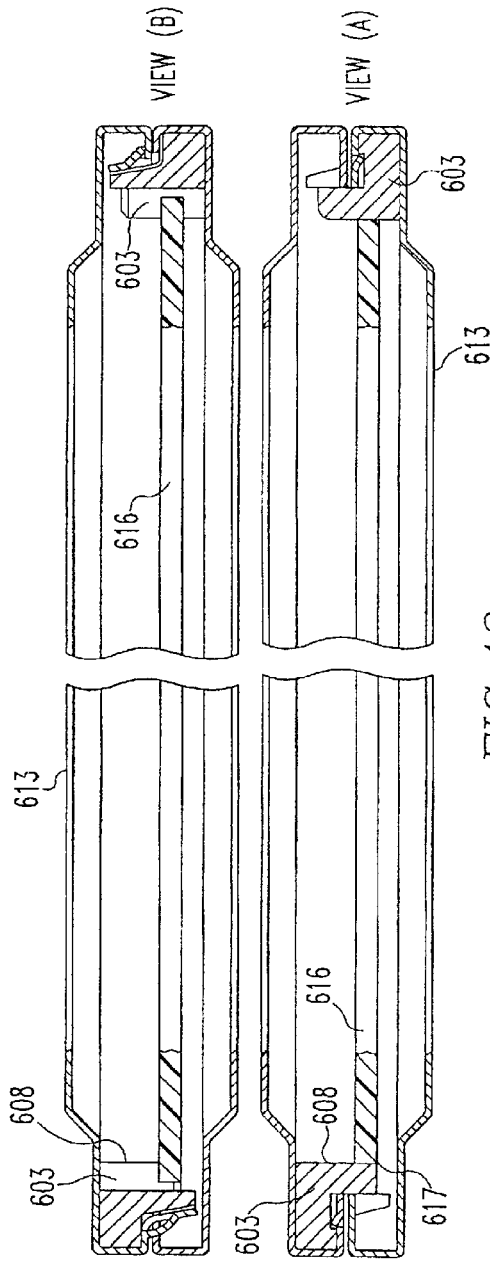
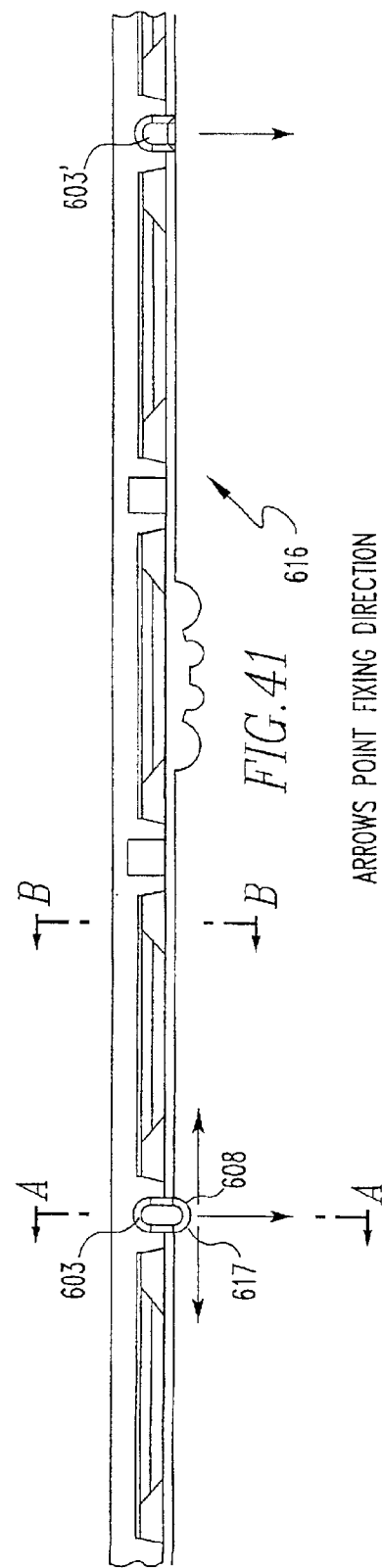
FIG. 42
FIG. 41 ARROWS POINT FIXING DIRECTION

ELECTRONIC CARD ASSEMBLY AND SHELL THEREFOR

This application is a continuation of U.S. application Ser. No. 09/297,776, filed Jul. 28, 1999 now U.S. Pat. No. 6,533,177 (herein incorporated by reference), which is the United States National Phase of International Application No. PCT/US97/14369, filed Aug. 13, 1997, both of which claim benefit of U.S. Provisional Application No. 60/047,398 filed May 22, 1997. U.S. application Ser. No. 09/297,776 also is a continuation of application Ser. No. 08/748,503, filed Nov. 8, 1996, which issued as U.S. Pat. No. 6,058,018 on May 2, 2000.

BACKGROUND OF THE INVENTION

1. Field of the Invention

The present invention relates to electronic cards and more particularly to exterior shells for such cards.

2. Brief Description of Prior Developments

Electronic cards are widely used, especially for adding capacity and/or functionality to personal computers. The Personal Computer Memory Card International Association (PMCIA) has established standards for such cards, and has categorized them as type I, type II and type III cards.

Previously cards have employed cover shields latched and/or adhesively fixed to an intermediate frame and covers laser welded or ultrasonically welded together. More recent cards employ metal shields that are directly fixed together, without a frame. However, there are difficulties experienced in having such structures maintain sufficient rigidity to withstand flexing, bending and tension forces which would be expected to be placed on it in the course of ordinary use. There is, therefore, a need for an electronic card which avoids the above mentioned difficulties.

SUMMARY OF THE INVENTION

The electronic card of the invention comprises a printed circuit board interposed between card shields having edges. Tabs on the edges of one shield engage recesses on the edge of the other shield. Adequate rigidity is thereby provided. Also included is an I/O connector grounded without a separate ground contact and shielded over its length.

The electronic card of another embodiment of the invention comprises a printed circuit board interposed between card shields having edges. Tabs on the edges of one shield engage recesses on the edge of the other shield. Adequate rigidity is thereby provided. A frame bar is interposed between the shields. Also included is an I/O connector grounded without a separate ground contact and shielded over its length.

BRIEF DESCRIPTION OF THE DRAWINGS

The invention is further described with reference to the accompanying drawings in which:

FIG. 1 is an exploded perspective view of an electronic card of the present invention;

FIG. 3 is an enlarged view of the area in circle III in FIG. 1;

FIGS. 4a–4h are schematic illustrations of various ways in which the tabs and recesses in the card illustrated in FIG. 1 may be engaged within the scope of the present invention;

FIG. 23 is a side elevational view of the shield shown in FIG. 22;

FIG. 24 is an end view of the shield shown in FIG. 22;

FIG. 26 is a side elevational view of the shield shown in FIG. 22;

FIG. 27 is an end view of the shield shown in FIG. 22;

FIGS. 35–38 are side and plan views of portions of the card;

FIGS. 39–42 are various perspective and schematic views illustrating the assembly of the frame in the shield;

DETAILED DESCRIPTION OF THE PREFERRED EMBODIMENTS

Figure 2:
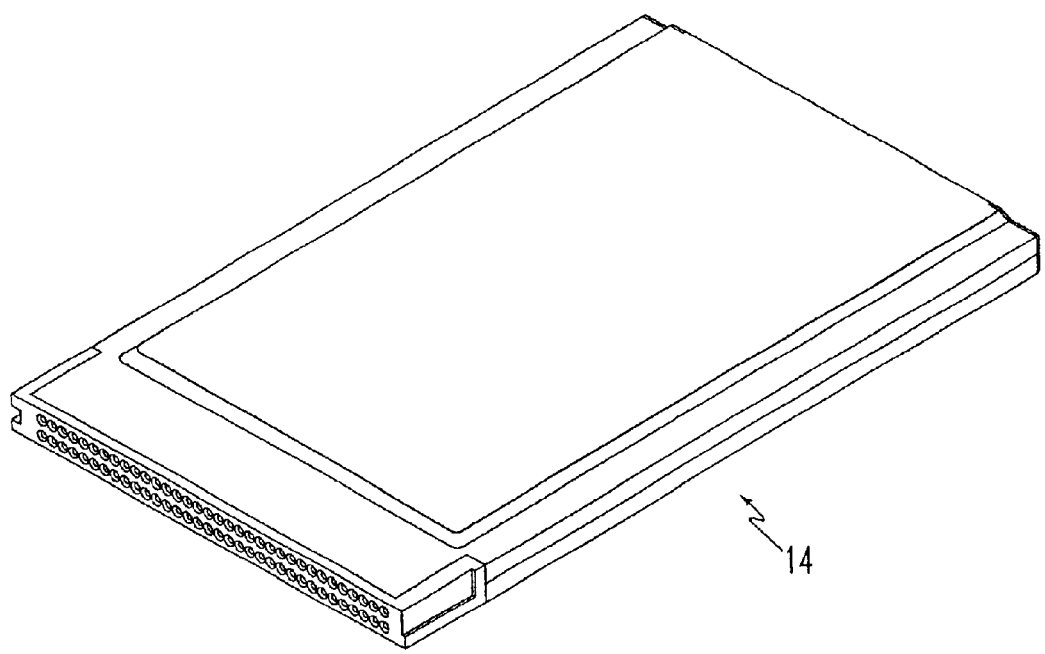
FIG. 2 is a perspective view of the card shown in FIG. 1.

Referring to FIGS. 1–3, the PCB assembly consists of the metallized receptacle I/O connector 1 at one end and the 68 pos MTB (MICRO TRIBEAM™) receptacle connector 2 at the other end of the board. This connector 2 has the two coding keys 3 and 4 integrated to sides of the plastic housing, simultaneously an upstanding ridge 5 on the top and bottom of this housing. On each of the two coding key ends of the connector 2, top and bottom surfaces, are also located two recesses 6. The I/O receptacle is described in detail hereafter.

The top and bottom card shields 7 and 8 are identical stampings of sheet metal eg. stainless steel. Over a substantial length of the shield, at one side are preferably periodically spaced, located upstanding tabs 9, and on the other side at same locations and periodicity appropriate recesses 10. In addition, at the front side 13 of a shield are located two fixation tabs 11, while at the rear side of each shield are extension portions 12 which are perpendicularly bent to be flush with in front of the metal shield of the connector plug opening of I/O connector 1. Such a perpendicular bend results in an improved aesthetics and also prevents an opening between I/O connector and shield and prevents what is known as a "smile" effect of the card while allowing for proper axial positioning of the PCB assembly.

When the two card shield halves 7 and 8 are positioned and moved toward each other over on either side of the PCB assembly, the tabs 9 and fixation tabs 11 cooperate with oppositely positioned recess 10 and 6 respectively, to obtain a final card assembly 14 shown in FIG. 2.

Ordinarily if only one tab 9 cooperates with one properly positioned recess 10, the force to retain the card assembly structure intact (see FIG. 2), notwithstanding the mechanical flexure/tension it is subjected to during application, is low. Due, to the employment of a relatively large number of tabs and recesses evenly spaced over the assembly length on both sides, sufficient rigidity of the assembly can be achieved. In general, there can be, and usually is, a true-position mismatch-match between tabs and the recesses, due to stamping tolerances. As a result, there can be a friction-fit of the two card shields on each other and with the recesses 6 of plastic housing of MTB connector 2. These individual friction forces can be enhanced by appropriate choice of the relative dimension/shape of the tab/recess cooperating together to form the mechanical structure. For example, considering the Section A of tab 9 in FIG. 4a, frictional engagement between the tabs and recesses can result if the tab is longer than the recess, as shown in FIG. 4d, the tab is twisted (FIG. 4e) or the tab is curved (FIG. 4c). In addition, several options for latching the tab in the recess are presented in FIG. 4b and FIG. 4g and 4c and 4h, wherein a latch 9a, either centrally located or formed on one end of the tab, by a sheared portion, latches the tab in the recess when fully mated. The objective of the latching arrangements is to withstand the mechanical forces and hold the assembly intact. Another object is to present substantially flat metal sides of card assembly to allow appropriate contact with a ground contact of equipment slot (not shown) which the PCMCIA card needs to fit.

Figure 5A:
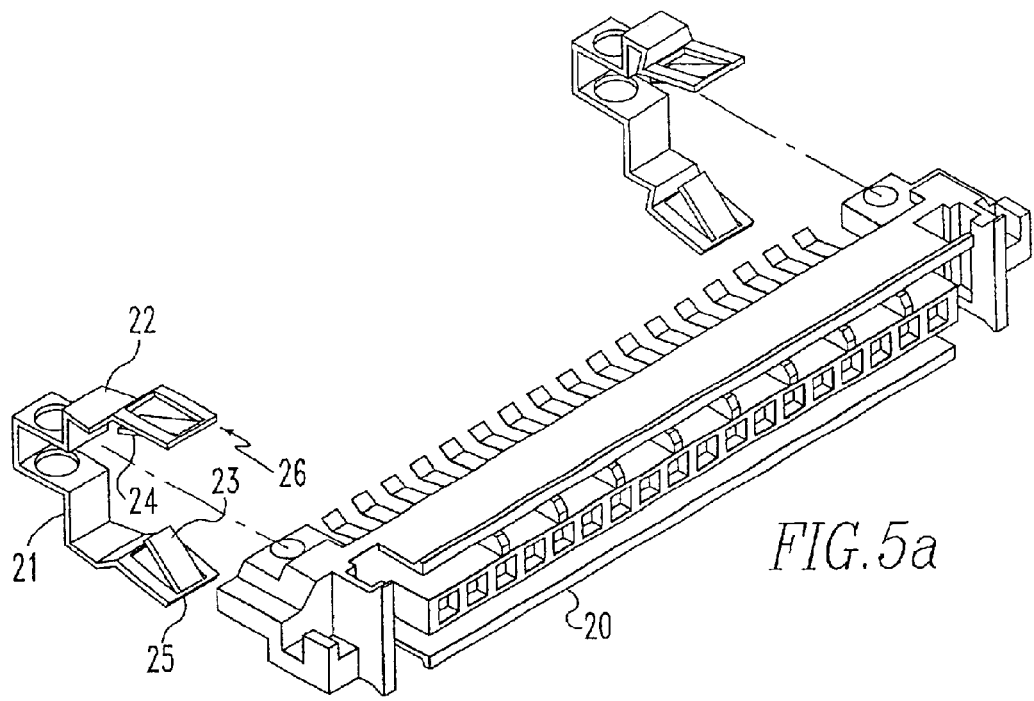
FIGS. 5a and 5b are respectively an exploded perspective view of an I/O connector used in the card shown in FIG. 1 and its accompanying universal grounding part and the I/O connector in which its universal grounding part is engaged.
Figure 5B:
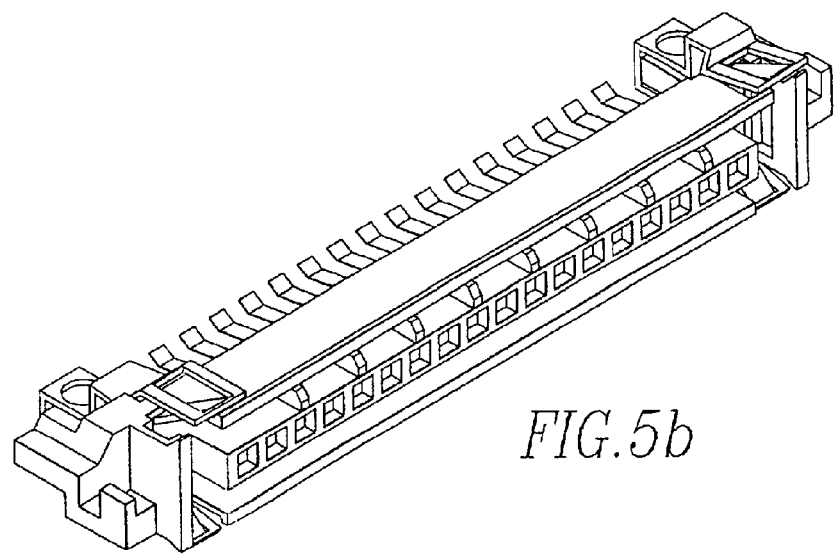

The I/O connector is shown in FIGS. 5a and 5b in which it is shown that plastic is removed at ends of the top and bottom plastic walls 20 to allow the entry from the rear (PCB side) of two metal springs with legs 21 and 22 having inwardly projecting latches 23 and 24 and ends 25 and 26. In the final assembled condition the latches 23 and 24 contact the metal shield plug connector 18 of assembled I/O plug connector while the ends 25 and 26 are pressed on metal upper and lower shields 7 and 8 to complete the total ground connection of system. These two metal spring members are connected to the ground track on the PCB at two connector ends by rivets, as in initial design.

Figure 6A:
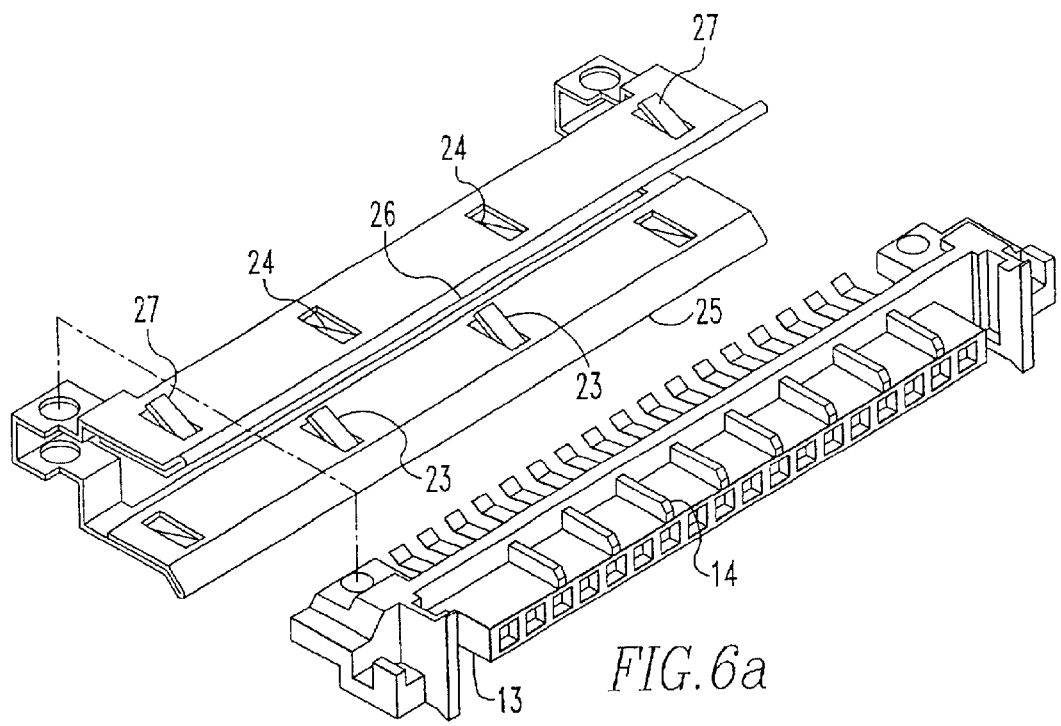
FIGS. 6a and 6b are respectively an exploded view of an alternate I/O connector and a view of the alternate I/O connector in which its grounding part is engaged.
Figure 6B:
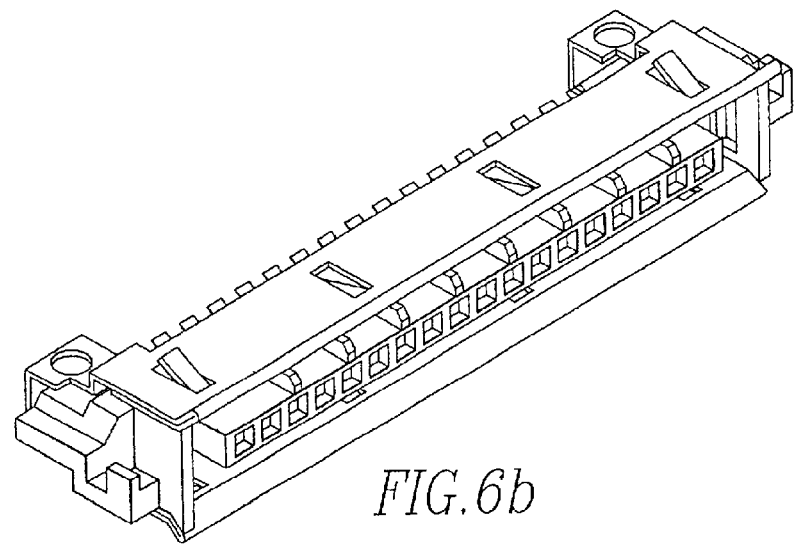

Referring to FIGS. 6a–6b, another embodiment is shown in which one metal piece is inserted over for the top and bottom plastic walls of receptacle I/O connector. The advantage in this arrangement, being not only, is one part needed, but that the metal shield extends over the total length of the connector while ensuring there is no potential drop between the two ground locations situated at connector ends. In this design, the inward projecting latches 23 and 24 face the central plastic insert 13 to finally connect with mating plug I/O shield 18. The outward latches 27 of the other side of the I/O connector contact the upper and lower shields 7 and 8, while the edges 25 and 26 are located also against the edges of the card shields.

Figure 7:
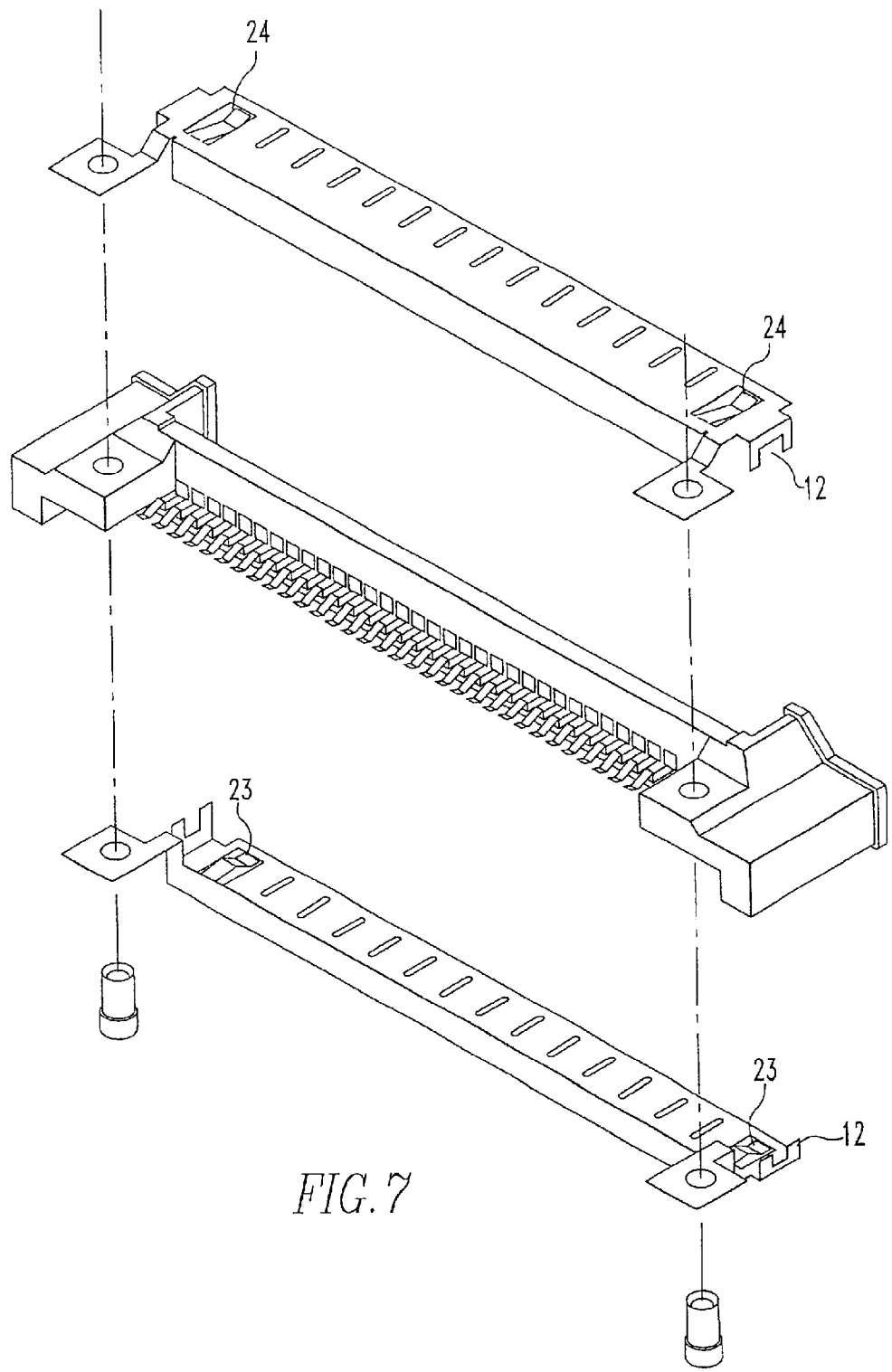
FIG. 7 is an exploded perspective view of an alternate shielded I/O receptacle.
Figure 8:
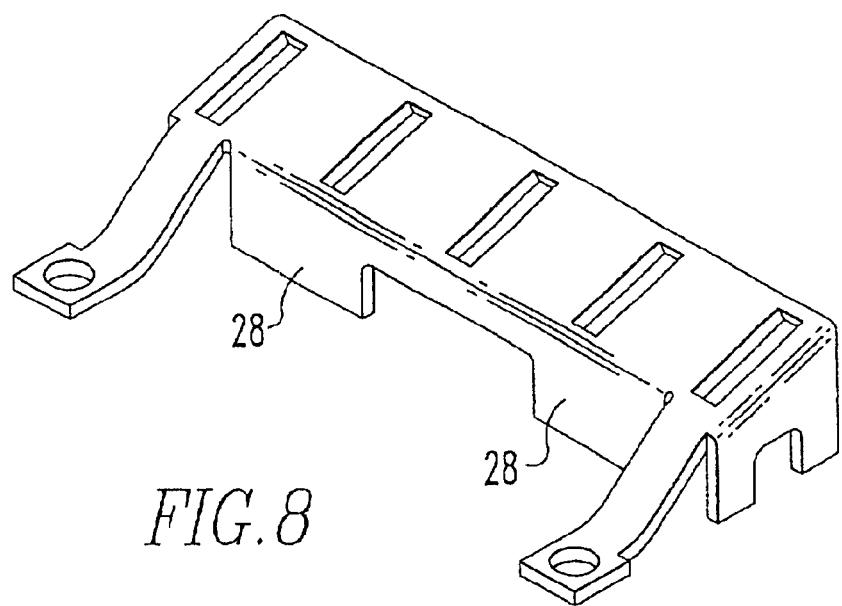
FIG. 8 is a perspective view of an alternate shield member which may be used with the I/O receptacle shown in FIG. 7.

Referring to FIGS. 7–8, a further development of the I/O receptacle shield in combination with the substitute for ground contact 7 in initial design, is shown. Here the upper and shield portions are shown as two separate half's, each with symmetrical segments of latch retaining openings 12 facing towards each other. This design alternative is not only present a metal plate with latch retaining openings, but also present at the rear end 28 of the receptacle I/O, besides the area needed for SMT legs of terminals, a metal wall over the remaining width of the card. This feature is more clearly evident in FIG. 4 showing the rear from the PCB side view of the receptacle I/O. This rear end 28 (FIG. 8) in this design when locked above a similar wall extending from lower shield portion, then affords a means for EMI/ESD shielding between the PCB electronics circuit I/O connector on this side of the card assembly.

Referring to FIGS. 9–16, the PCB assembly includes the metallized receptacle I/O connector 101 at one end and the 68 pos MTB receptacle connector 102 at the other end of the board. This MTB connector 102 has the two coding keys 103 and 104 integrated to sides of the plastic housing, simultaneously an upstanding ridge 105 on the top and bottom of this housing. On each of the two coding key ends of the MTB connector 102, top and bottom surfaces, are also located on the I/O connector ends and two recesses 106. The I/O receptacle is described in detail hereafter.

The top and bottom card shields 107 and 108 are sheet metal e.g. stainless steel. Over a substantial length of the shield, at one side are periodically located upstanding tabs 109, and on the other side at same locations and periodicity are appropriate recesses 110. In addition, at the front side 113 of a shield is located a fixation tab 111, and at the rear side of the shield are extension portions 112 which are perpendicularly bent to be flush with in front of the metal shield of the connector plug opening of I/O connector 101 in the final card assembly condition. Such a perpendicular bend results in an improved aesthetics of the card while allowing for proper longitudinal axial positioning of the PCB assembly.

When the two card shield halves 107 and 108 are positioned and moved towards each to enclose of the PCB assembly, the tabs 109 cooperate with recess 110 along side and fixation tabs 111 cooperate with oppositely positioned recess 144 on the opposite side of the top shield through slot 100, to obtain a final card assembly.

The periodicity of tabs and recess over the assembly length on both sides, is sufficient to ensure the desired assembly rigidity. As previously stated, there usually is a true-position miss-match between the tabs and recess, due to stamping tolerances. This arrangement, then results in at least an initial friction-fit of the two card shields on each other by reason of the side tabs 109 entering side recesses 110, and two front fixation tabs 111 passing through two 106 to enter front recess 144 of the opposite shield of plastic housing of connector 102. These individual friction forces can be enhanced by appropriate choice of the relative dimension/shape of the tab/recess cooperating together to form the mechanical structure.

Figure 9:
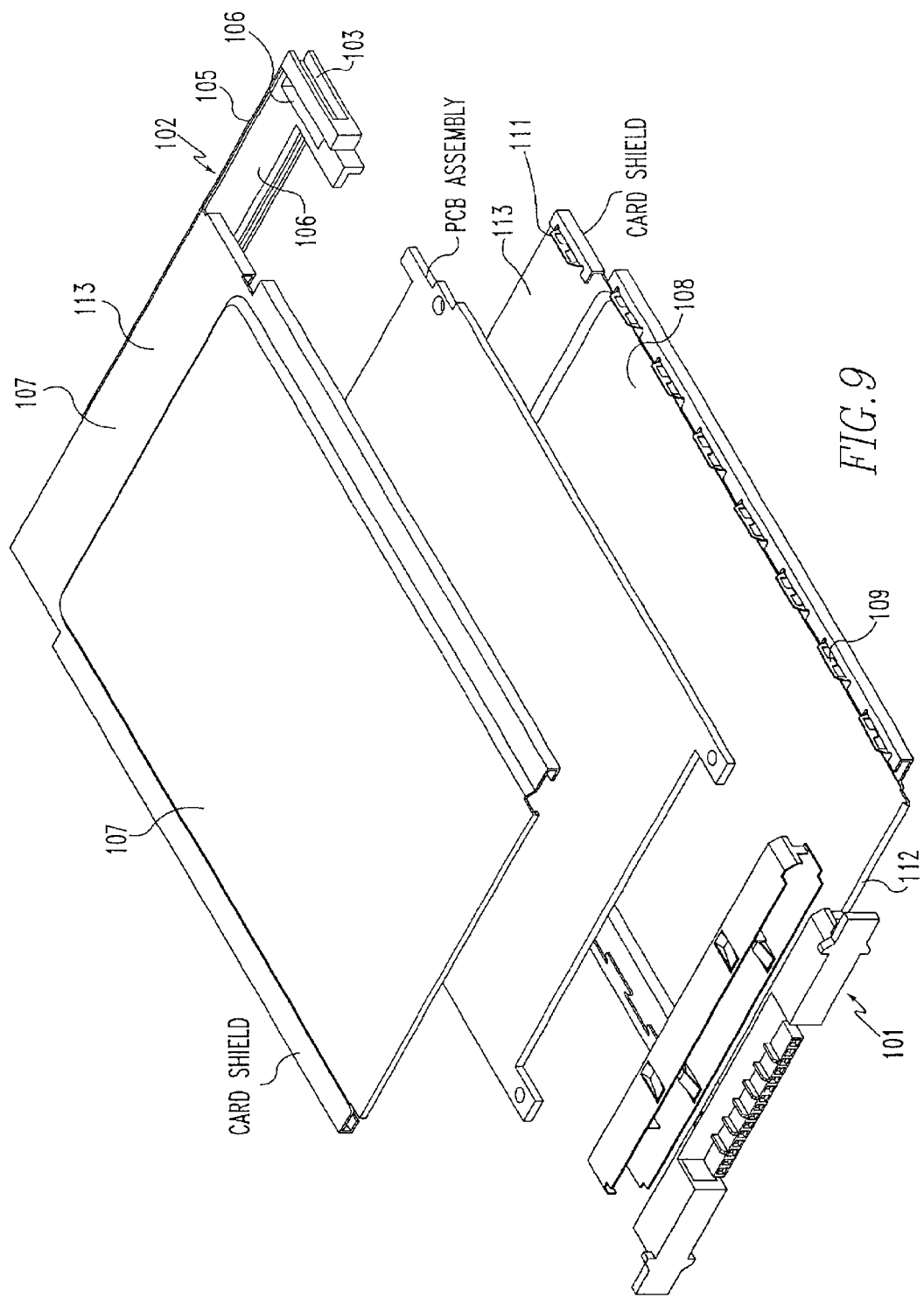
FIG. 9 is an exploded perspective view of an alternate preferred embodiment of the card of the present invention.
Figure 10:
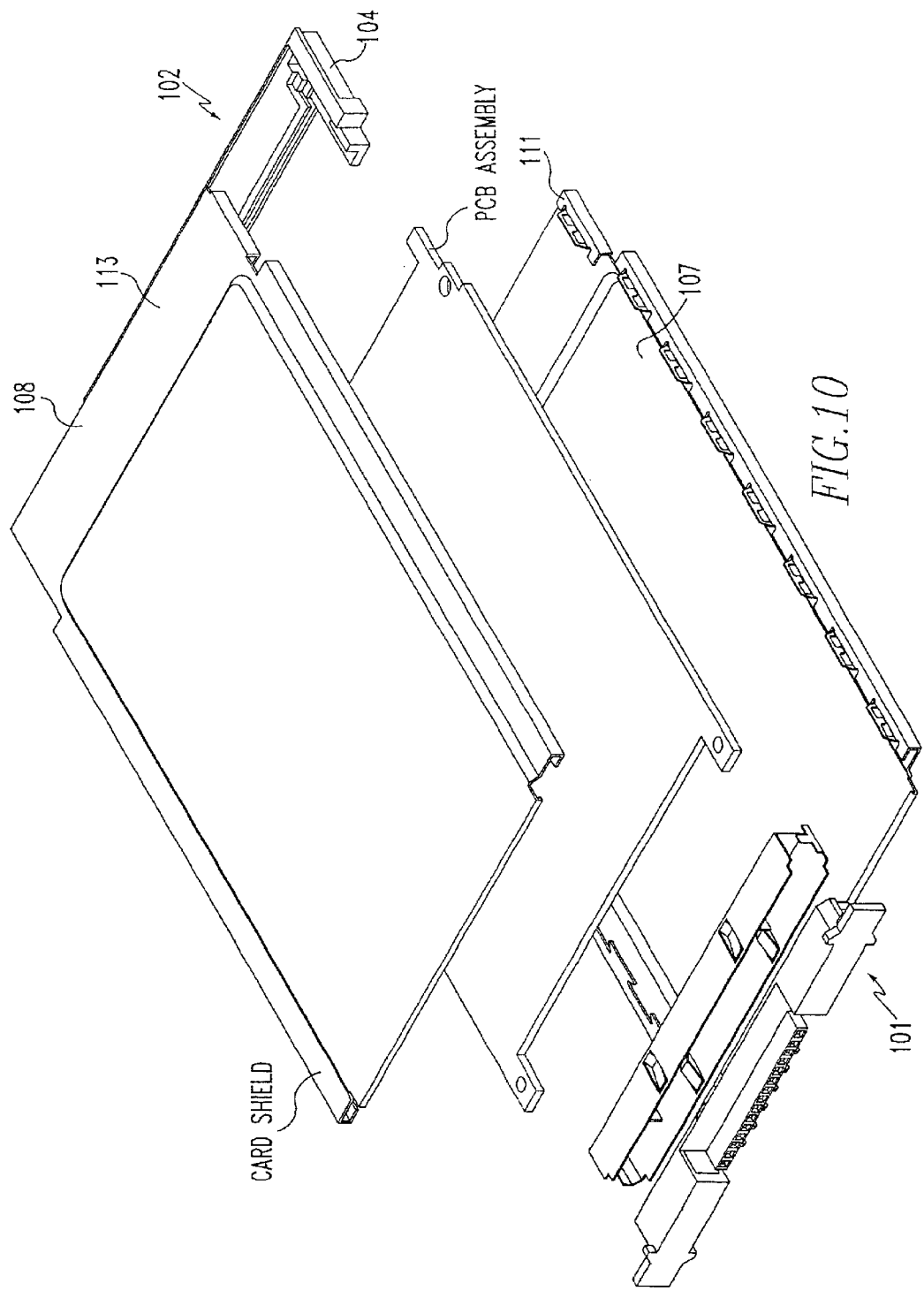
FIG. 10 is a bottom perspective view of the card of FIG. 9.
Figure 14:
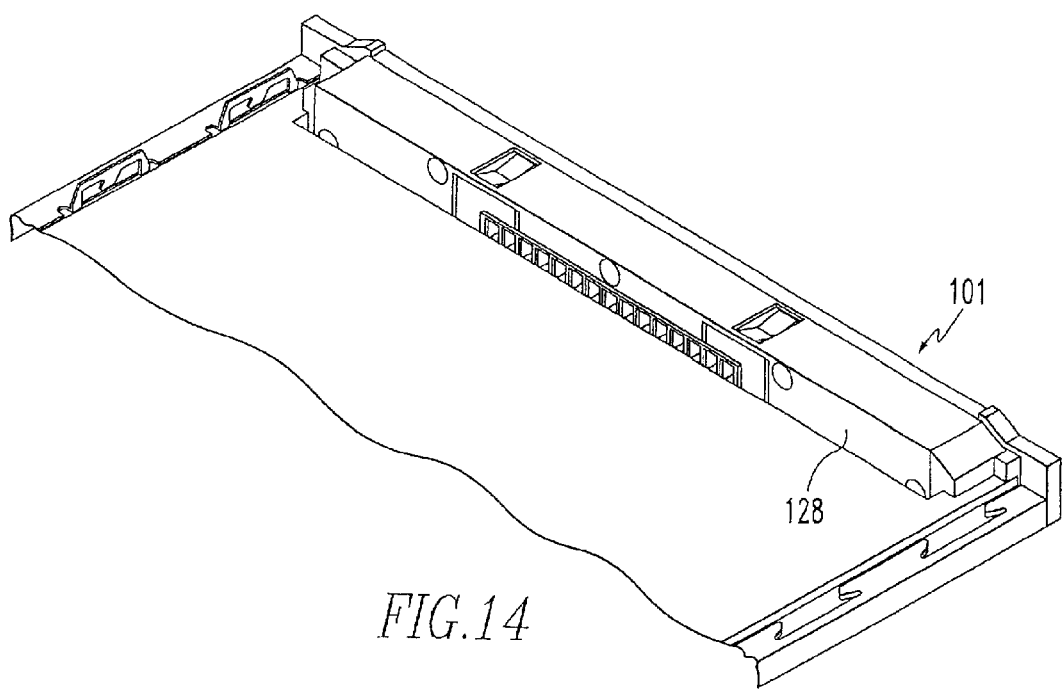
FIG. 14 is a detailed view of the I/O connector used in the card connector shown in FIG. 9.

Referring particularly to FIGS. 9–10 and 14, a further development of the I/O receptacle shield in combination with the substitute for ground contact 107 in initial design, is shown. Here the upper and shield portions are shown as two separate halves each with symmetrical segments of latch retaining openings 112 facing towards each other. This design is not only present at a metal plate with latch retaining openings, but also present at the rear end 128 of the receptacle I/O, besides the area needed for SMT legs of terminals, a metal wall over the remaining width of the card.

Figure 11:
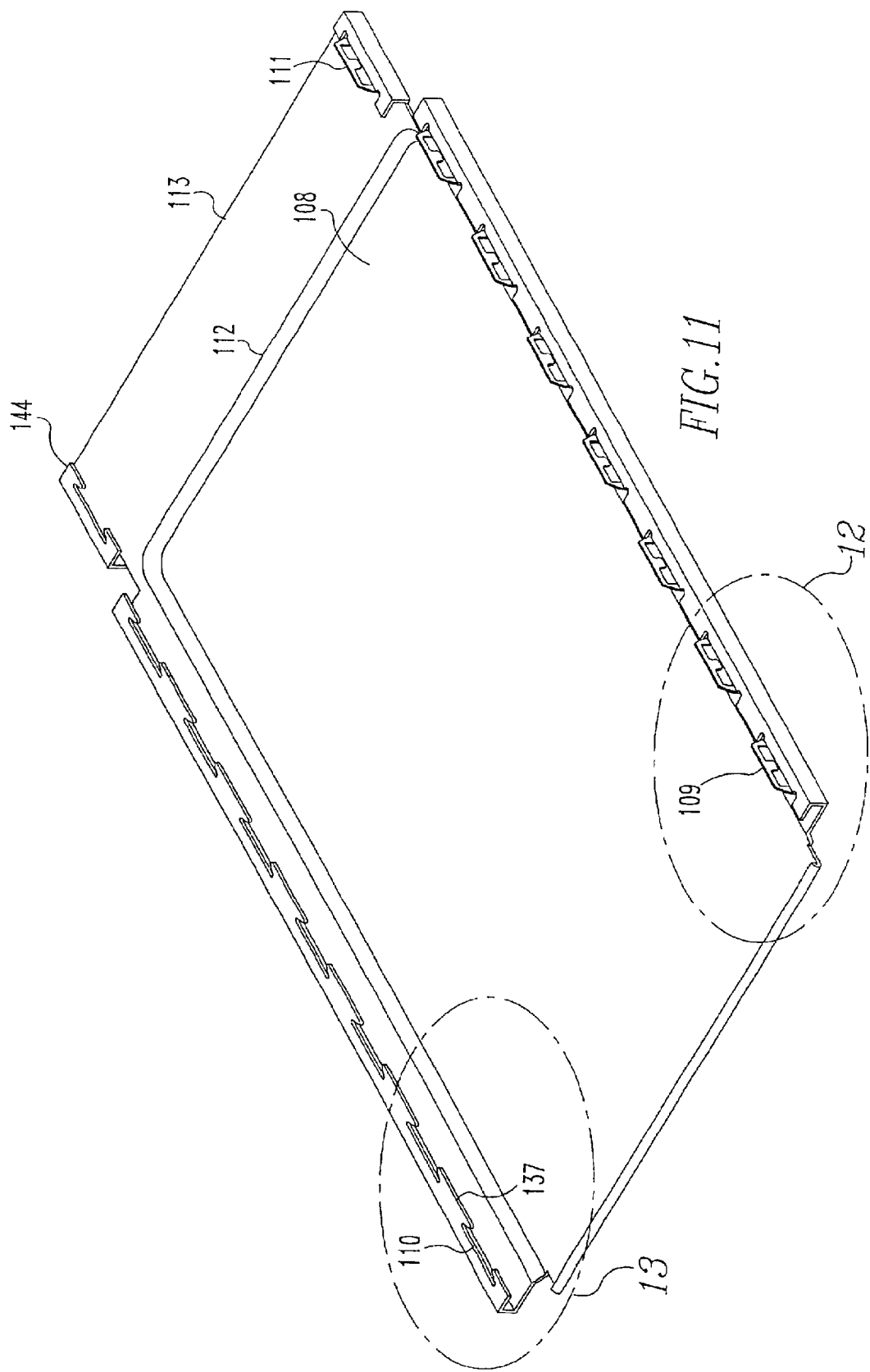
FIG. 11 is a top perspective view of a card shield used in the card shown in FIG. 9.
Figure 12:
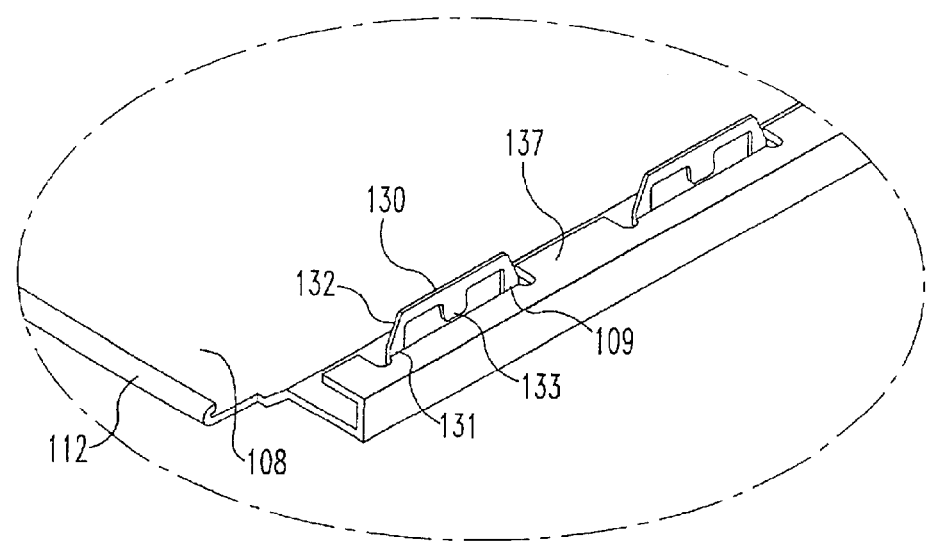
FIG. 12 is a detailed view of the area within circle XII in FIG. 11.
Figure 13:
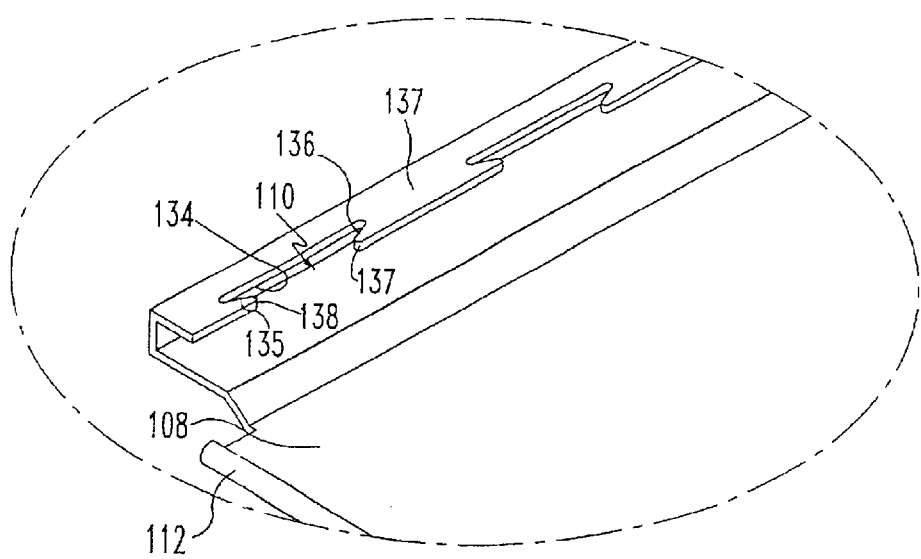
FIG. 13 is a detailed view of the area with circle XIII in FIG. 11.
Figure 15:
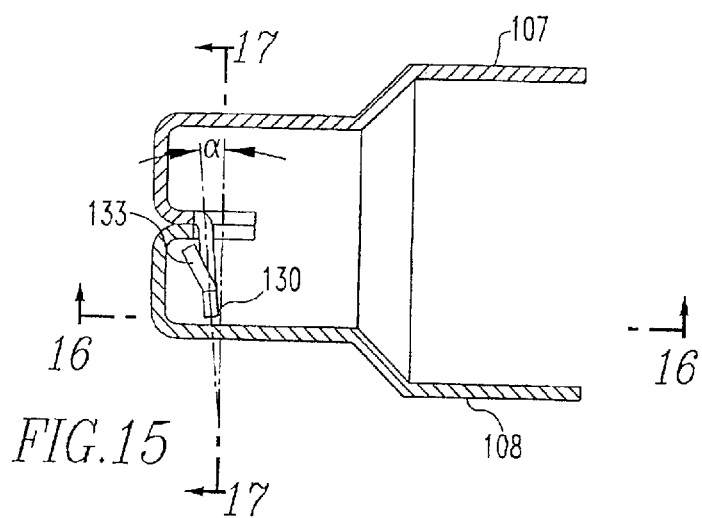
FIG. 15 is a cross sectional view through an engaged latch.
Figure 16:
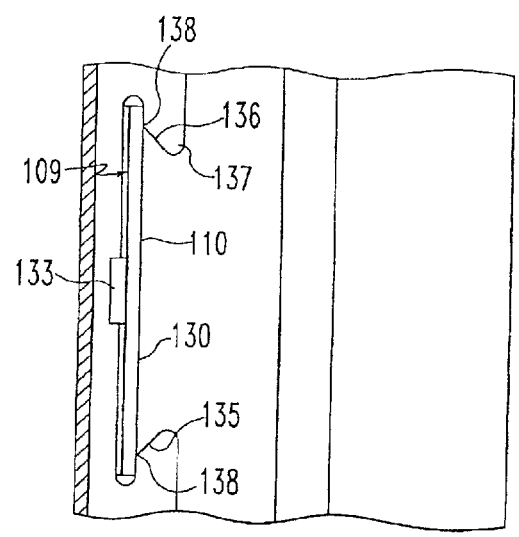
FIG. 16 is a cross section through XVII–XVII in FIG. 16.
Figure 17:
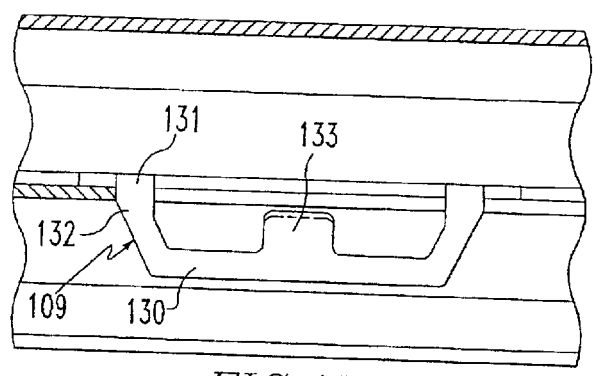
FIG. 17 is a cross section through XVIII–XVIII in FIG. 16.
Figure 18:
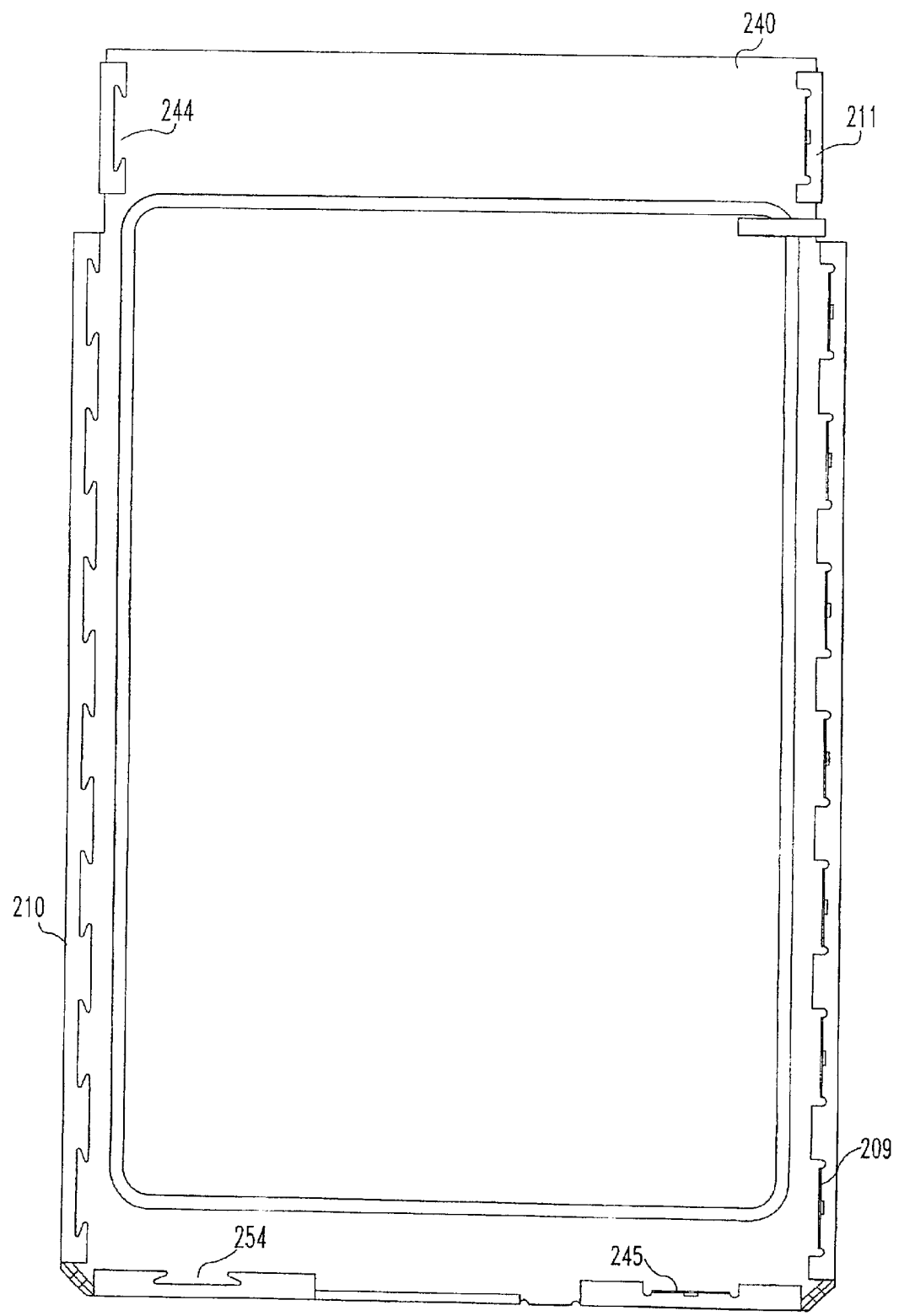
FIG. 18 is a top plan view of a shield used in another preferred embodiment of the card of the present invention.

FIG. 11 and 12 shows modified forms of securing tabs wherein the tabs 109 comprise an upstanding arcuate section 130 having opposed rigid sides 131 and chamfers 132 from which a spring latch 133 extends downwardly and outwardly. Referring particularly to FIG. 13, the recesses 110 are formed in a ledge 134. The ends of the recesses 110 have edges 135 and 136 which are angled inwardly to points 138. Referring particularly to FIGS. 15–17, the tab 133 engages the underside of ledges 134 in the recesses 110.

The two card shields of this embodiment are preferably made from 0.2 mm stainless steel and have a number of mechanical snap fit fasteners. After assembling the two shields to each other, these fasteners make the card surprisingly and unexpectantly rigid and stiff against bending and torsion. These fasteners also effect good electrical connection for grounding between the two card shields due to multiple contact points, and also because no intermediate load bearing surfaces are utilized the card is optimally shielded for EMI. These fasteners comprise a number of tabs 109 which engage recesses 110. It will be seen from the drawings (in parts at FIGS. 15 and 16) that each of the tabs 109 and latch 133 are angled inwardly from the perpendicular plane, for example, by angle of (FIG. 15) to better engage the recesses 110. Each tab 109 comprises a spring section 132 integrated with a latch 133, which hooks in a latch 134 underneath the area of each recess 110. This latch 133 holds the two card shields from opening after assembly. During mating, the tab 109 will be subjected to elastic bending and torsion forces from the tip of latch 133 up both rigid sides.

Each tab 109 includes also two rigid sides 131 which engage with some play in both ends of the recess 110. The total number of rigid sides 131 and recess ends give the mechanical connection between the two card shields a high shear strength, which results in a high stiffness against bending and torsion. It will also be noted that the two card shields are identical and are hermaphodite, that is, each shield contains both male and female fastening elements.

As is shown in particular with regard to FIGS. 12–14, during mating the chamfers 132 will first touch the leading edges 135 and 136 so that they will guide the tab 109 to the end position beyond points 138 and guarantee that the latch 133 will hook underneath edge 134. The points 138 function as latches to hold the tab in position in the recess and provide an audible "snap" that indicates proper latching. The relative dimensions of the chamfers 132 and ledges 135 and 136 are designed to absorb manufacturing (stamping) tolerances.

The latch mechanism is designed in a way that there is an initial play between the latch and the ledge 134 in vertical direction, which is taken away by a second spring function of ends 137 of the ledge. As these ends have a bending angle less than 90°, these make first contact when assembling the two card shields and then these have to be pressed together a little before the latch 133 will be mated. After that the latch mechanism has no further play.

Preferably the overall cumulative lengths of the spring like tabs will be at least 10% of the length of the shield and more preferably will be 50% of the length of the shield.

Referring particularly to FIG. 9, it will also be seen that there is a slot 106 at each end of the connector 102, which allows the tab 111 to pass through the connector to engage a recess 144 in the opposing card shield. Thus there is a completely metal to metal contact so that it is not necessary to engage the plastic in the connector 102. More particularly, if only two card shields 107 and 108 are engaged without using the connector 101 and 102 the resulting card case is rigid.

A torque test, bend test and finger nail simulation test were conducted on this second PCMCIA card version described above. The tests are shown respectively on the attached Tables I, II and III.

Figure 20:
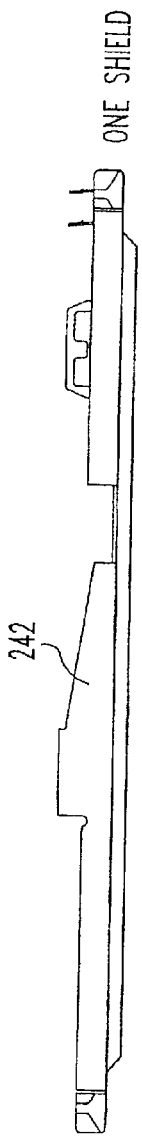
FIG. 20 is an end view of the shield shown in FIG. 18.
Figure 21:
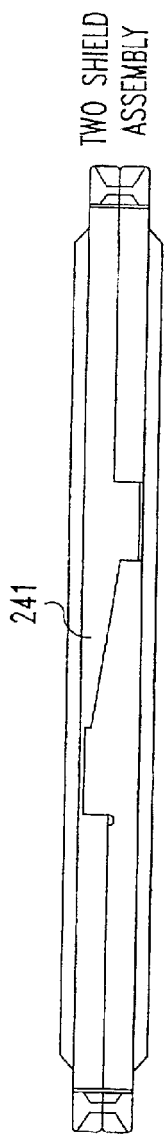
FIG. 21 is an end view of the entire card which makes use of the shield shown in FIG. 18.
Figure 19:
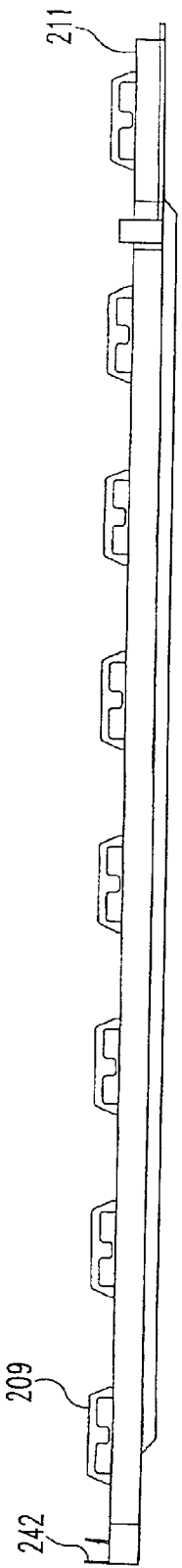
FIG. 19 is a side elevational view of the shield shown in FIG. 18.
Figure 22:
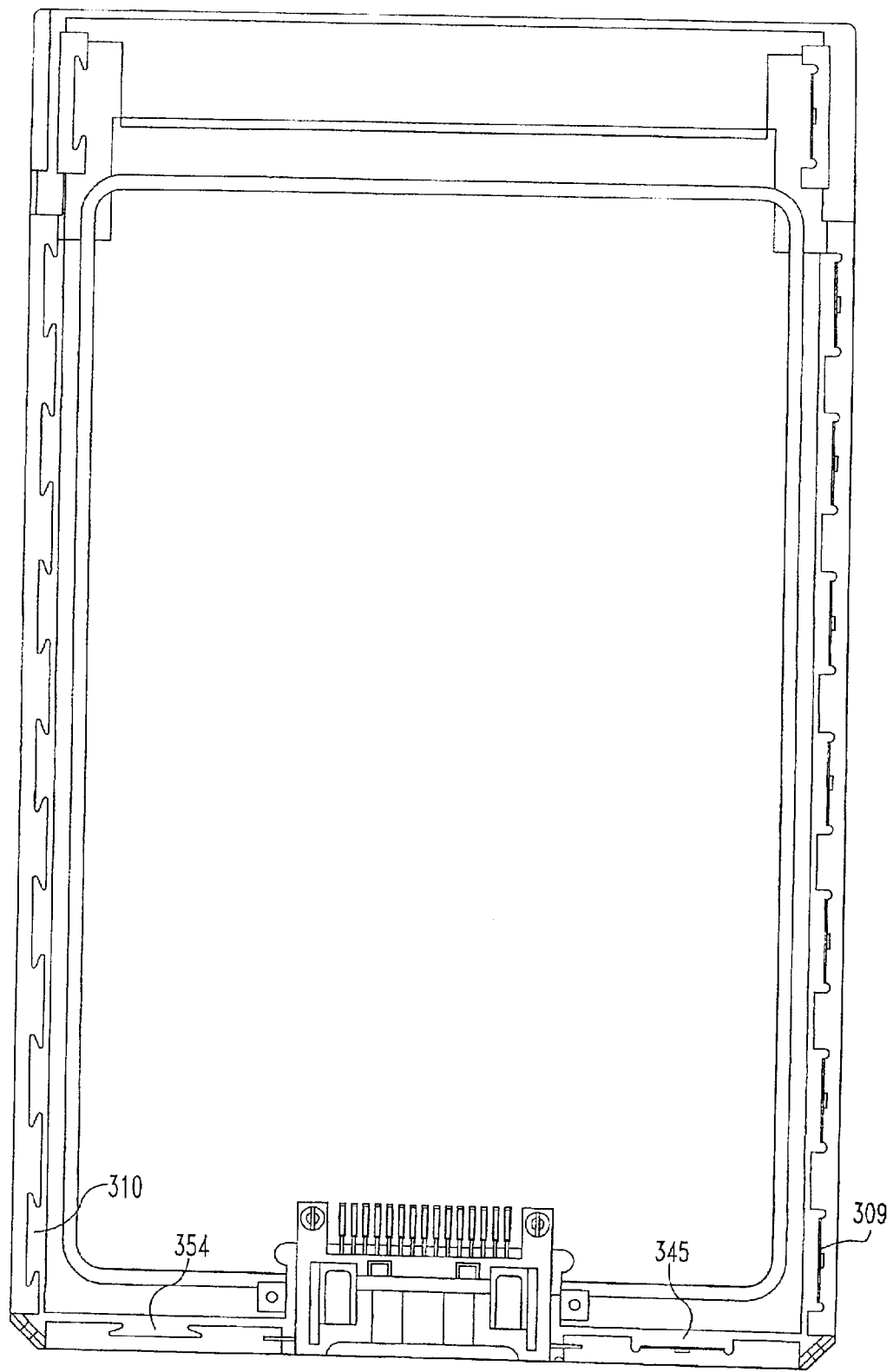
FIG. 22 is a top plan view of a shield used in another preferred embodiment of the card of the present invention.

Referring to FIGS. 18–21, an embodiment is shown in which no I/O receptacle is employed. Otherwise this embodiment is generally the same as that described in FIGS. 9–17. That is, it has identical tabs 245 which engage identical recesses 254, and it also has a space 240 for an MTB connector (not shown). Referring particularly to FIGS. 20–21, it will be noted that the joining tabs and recesses of the rear are disposed to the side and there is centrally adjoining panels 241 and 242. Referring to FIGS. 22–24, another embodiment is shown which is similar to the foregoing embodiment except that it makes use of a single 15 position I/O connector 343. The tabs 309 and recesses 310 are the same as was described above. In this embodiment the connecting tabs and recesses 345 and 354 respectively are positioned outwardly adjacent the I/O connector on the front end of the card while tabs 311 and recess 344 cooperate with each other on the MTB connector side.

Figure 25:
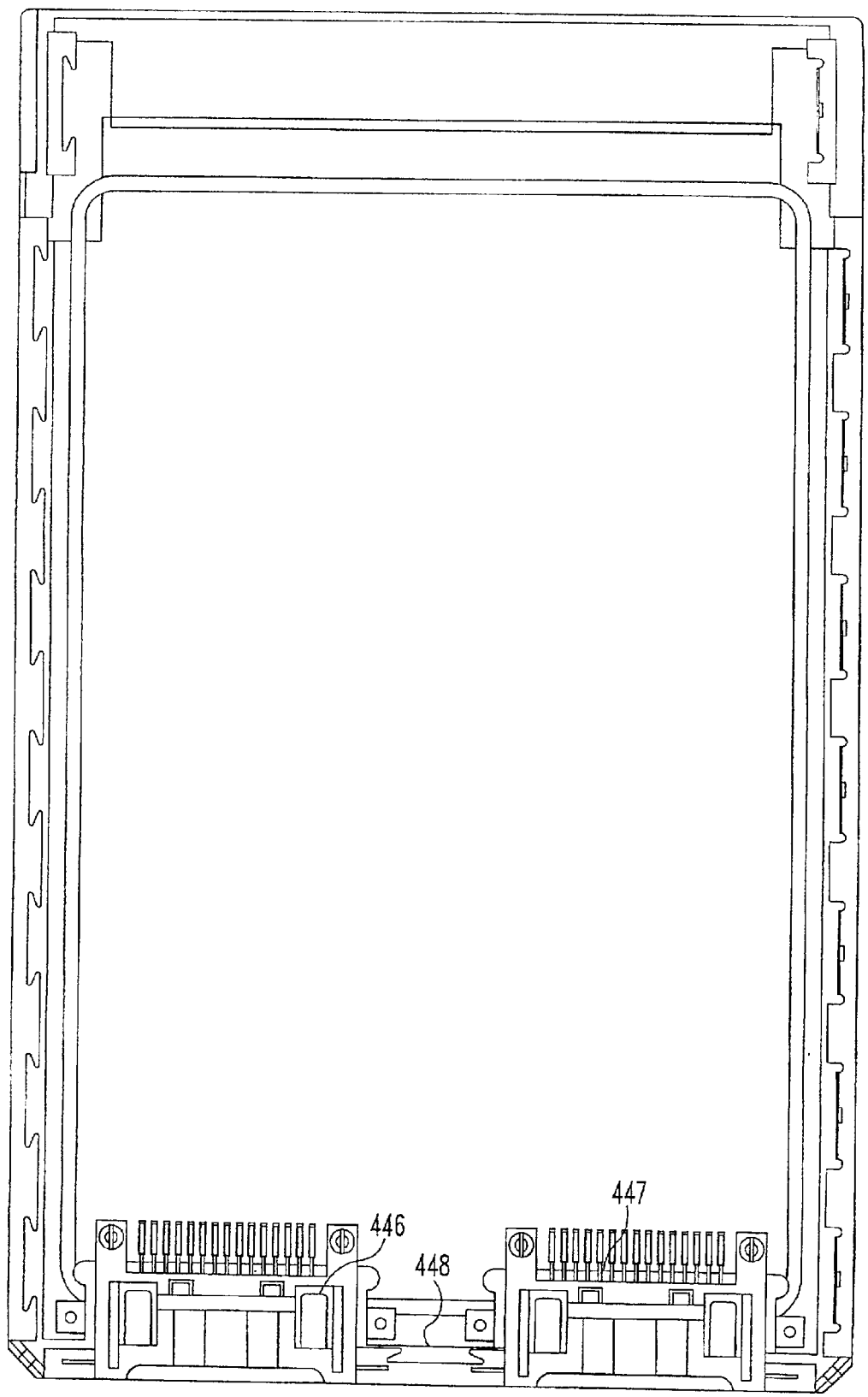
FIG. 25 is a top plan view of a shield used in another preferred embodiment of the card of the present invention.

Referring to FIGS. 25–27, another embodiment is shown which makes use of two I/O connectors 446 and 447. Otherwise this embodiment is essentially the same as the ones described above. It will be noted that at the rear end of this card the tab and recess 448 are positioned between the I/O connectors and the rear side of the card.

Figure 29:
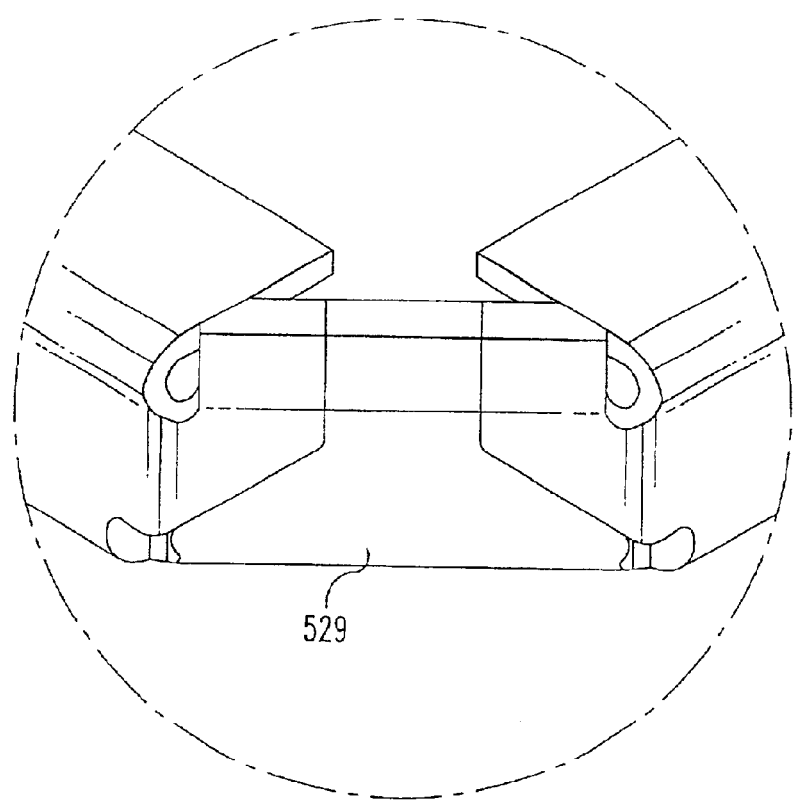
FIG. 29 is an enlarged view of the area within circle XXIX in FIG. 28.
Figure 28:
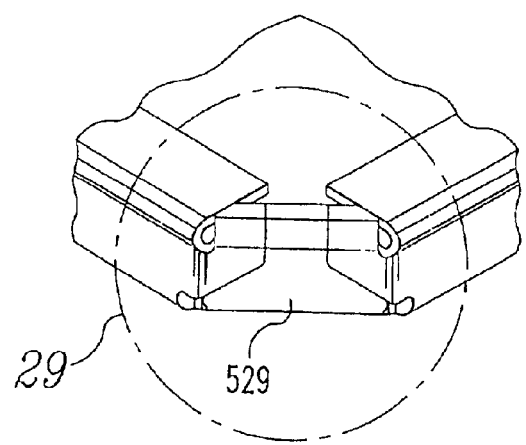
FIG. 28 is a partial perspective view of the shield shown in FIG. 18.
Figure 31:
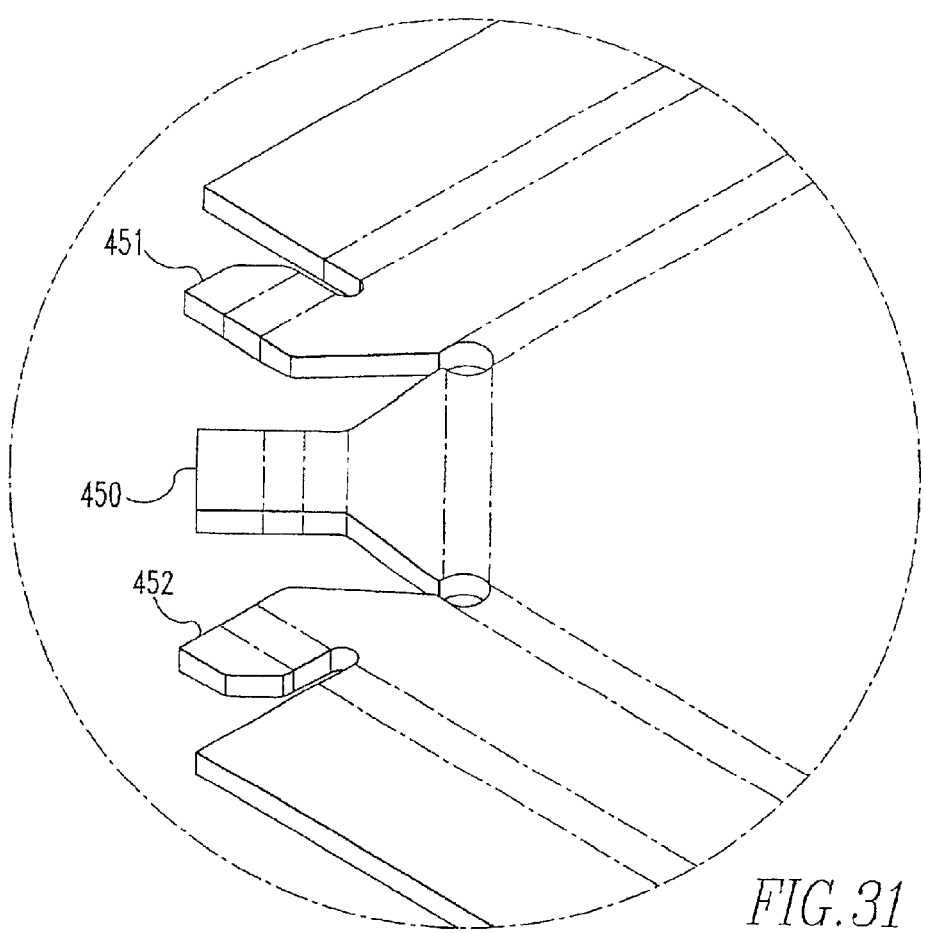
FIG. 31 is an enlarged view of the area within circle XXXI in FIG. 30.
Figure 30:
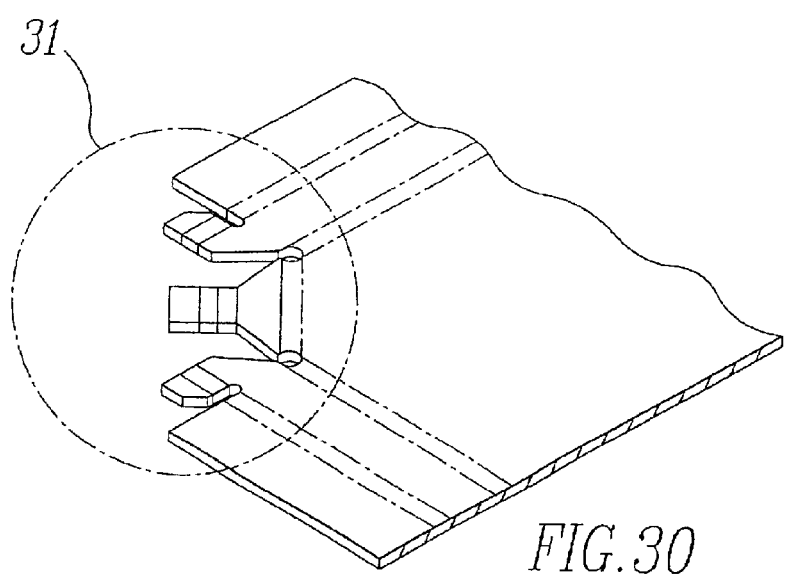
FIG. 30 is a blank from which the shield shown in FIG. 18 may be manufactured.
Figure 32A:
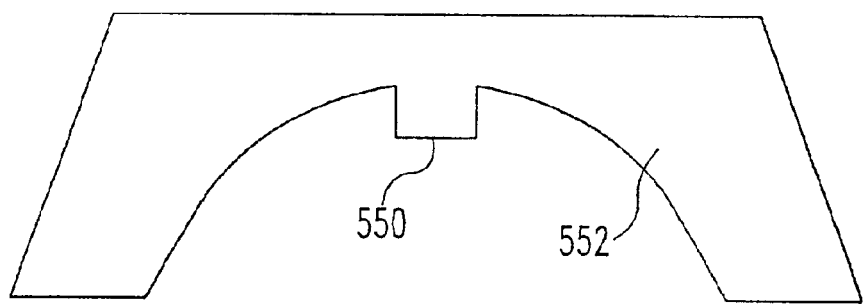
FIGS. 32a and 32b are views of alternate preferred embodiments of tabs and recesses respectively.
Figure 32B:
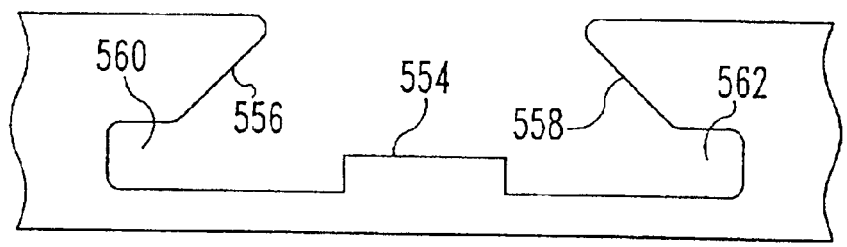

Referring to FIGS. 28–29, it will be seen that the full metal corners of the embodiments described above are comprised of a folded metal wall shown generally at 549. Referring to FIGS. 30–31, it we be noted that this curved corner may be produced from a blank having a medial protrusion 450 and lateral protrusions 451 and 452 which may be folded upwardly and inwardly in segments to produce the desired rounded effect. Those skilled in the art will appreciate the advantages of the construction of this full metal corner in terms of EMI/ESD shielding or similar full metal shielding without use of plastic or open air. This feature is also aesthetically advantageous since it has no sharp edges.

The following modifications may also be incorporated into the card described above.

a) Incorporating a frame-bar in addition to the metal card shields to support the interior electronic circuitry; and b) Affording a means to mechanically connect and fix the metal card shields to the PCB.

In this additional embodiment, means are provided to appropriately align the two end connectors (I/O and the MTB connector) with respect to the PCB before their fixation by a solder reflow process. Preferably this alignment should be achieved without the need of tight connector peg-to-board hole clearances. Removing this requirement for both or one (e.g. MTB side) PCMCIA case would suffice.

To incorporate these changes a design modification has been undertaken without alteration to the basic metal latch snap-fit feature discussed earlier on edges of metal shield; neither is there a change to the basic I/O connector configuration.

1) Frame-bar

Figure 33:
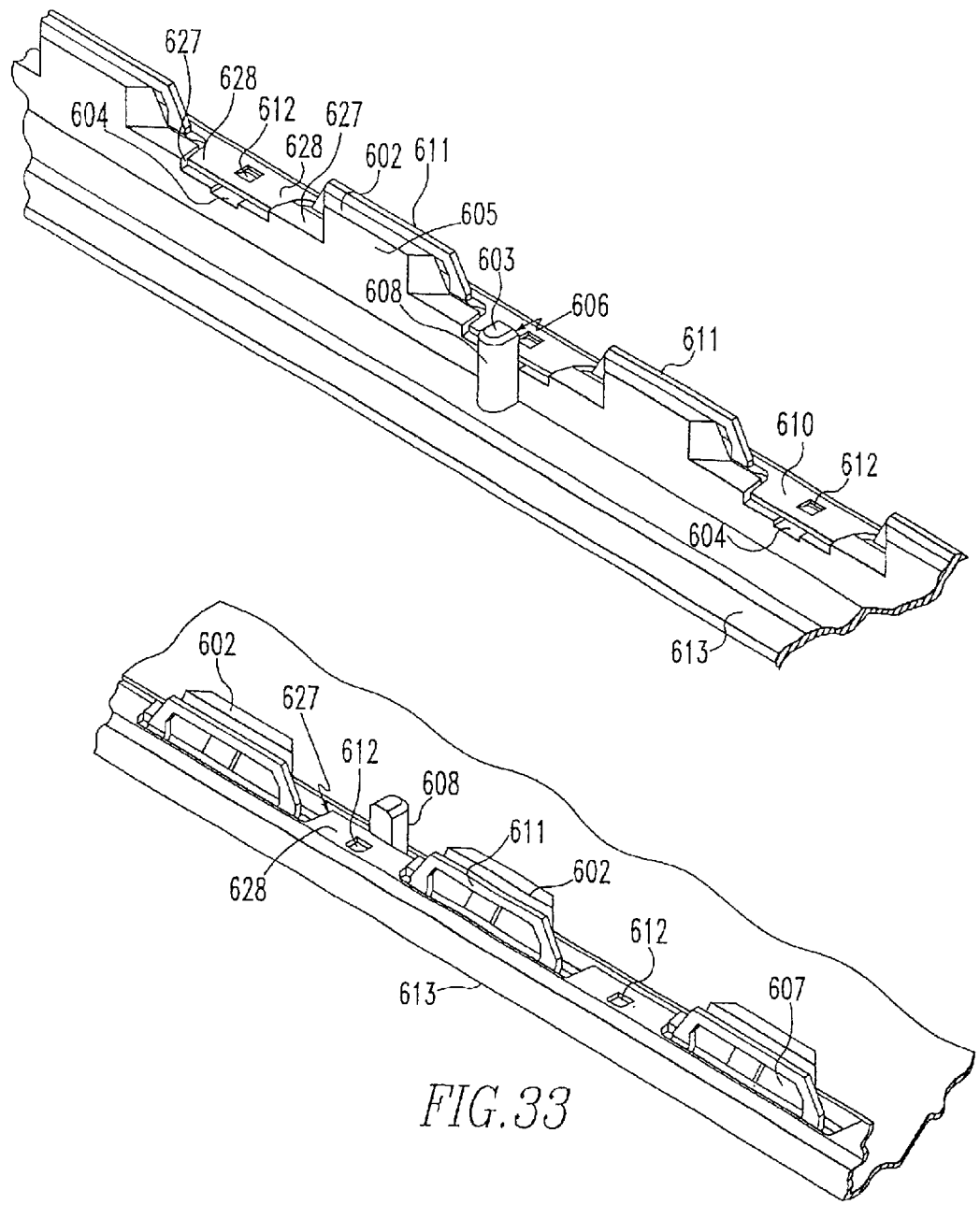
FIG. 33 is a detailed perspective fragmented views of the frame bars used in the card of the present invention.
Figure 34:
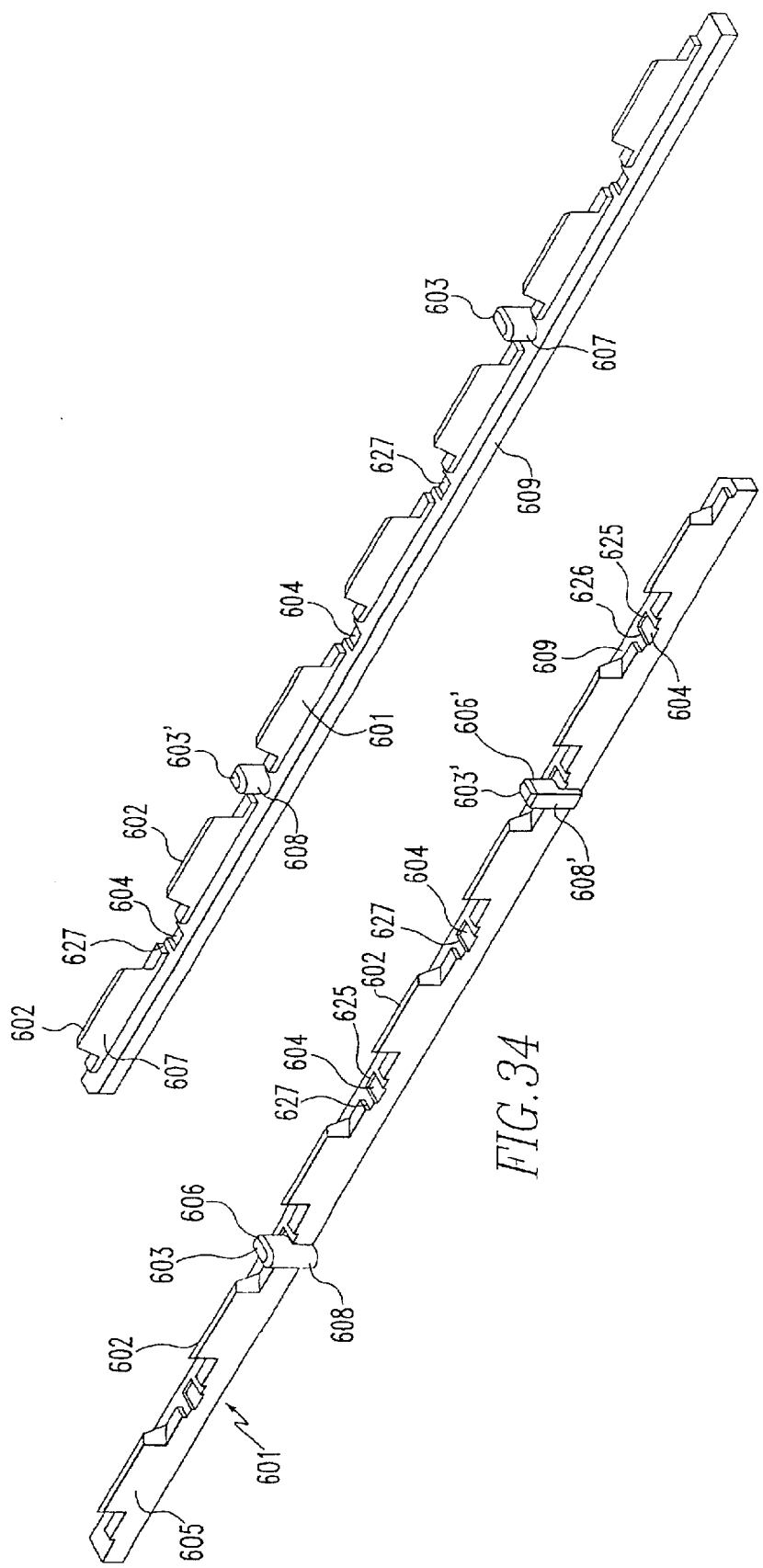
FIG. 34 is a perspective view of the entire frame bar shown in FIG. 1.
Figure 36:
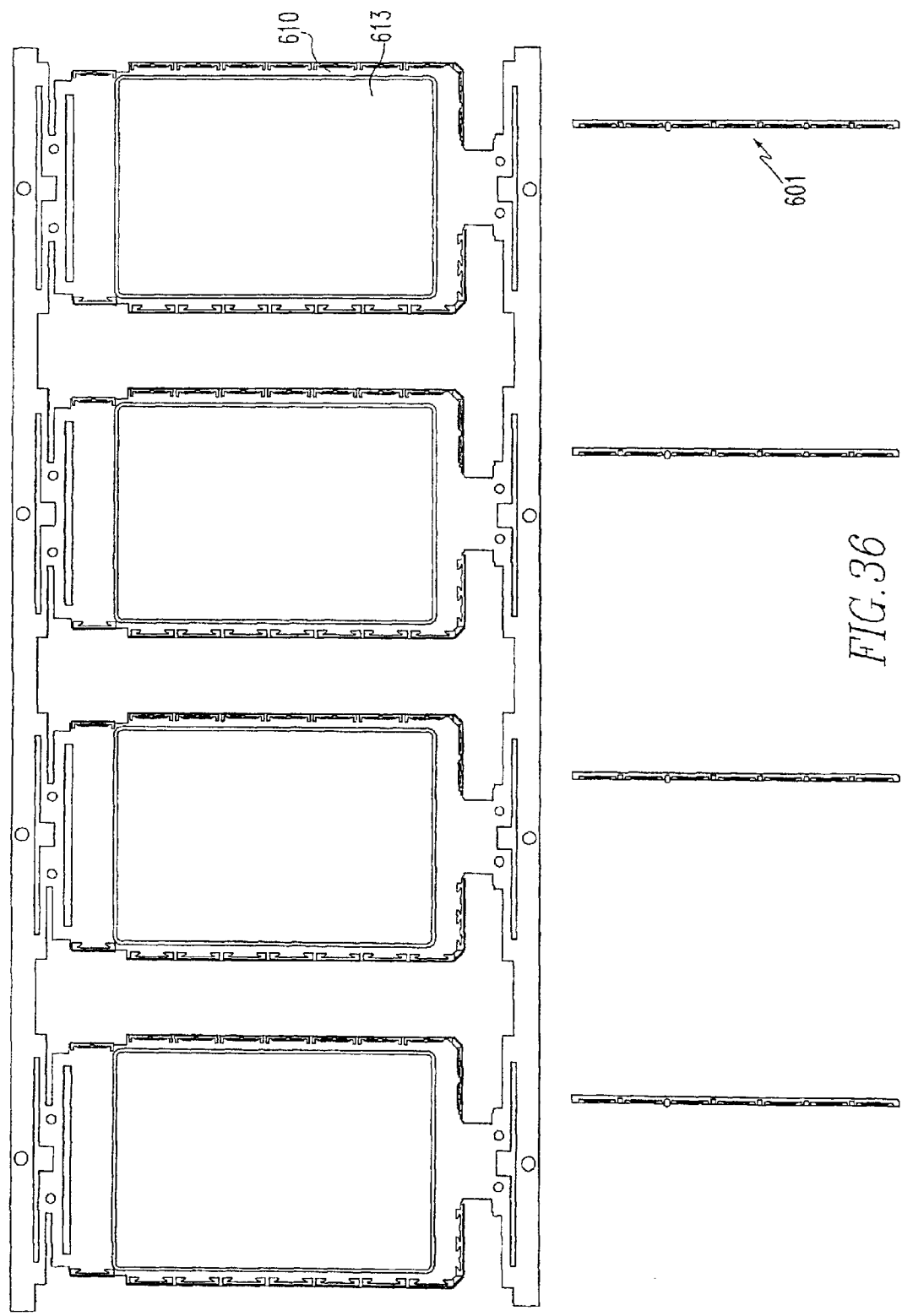
Figure 37:
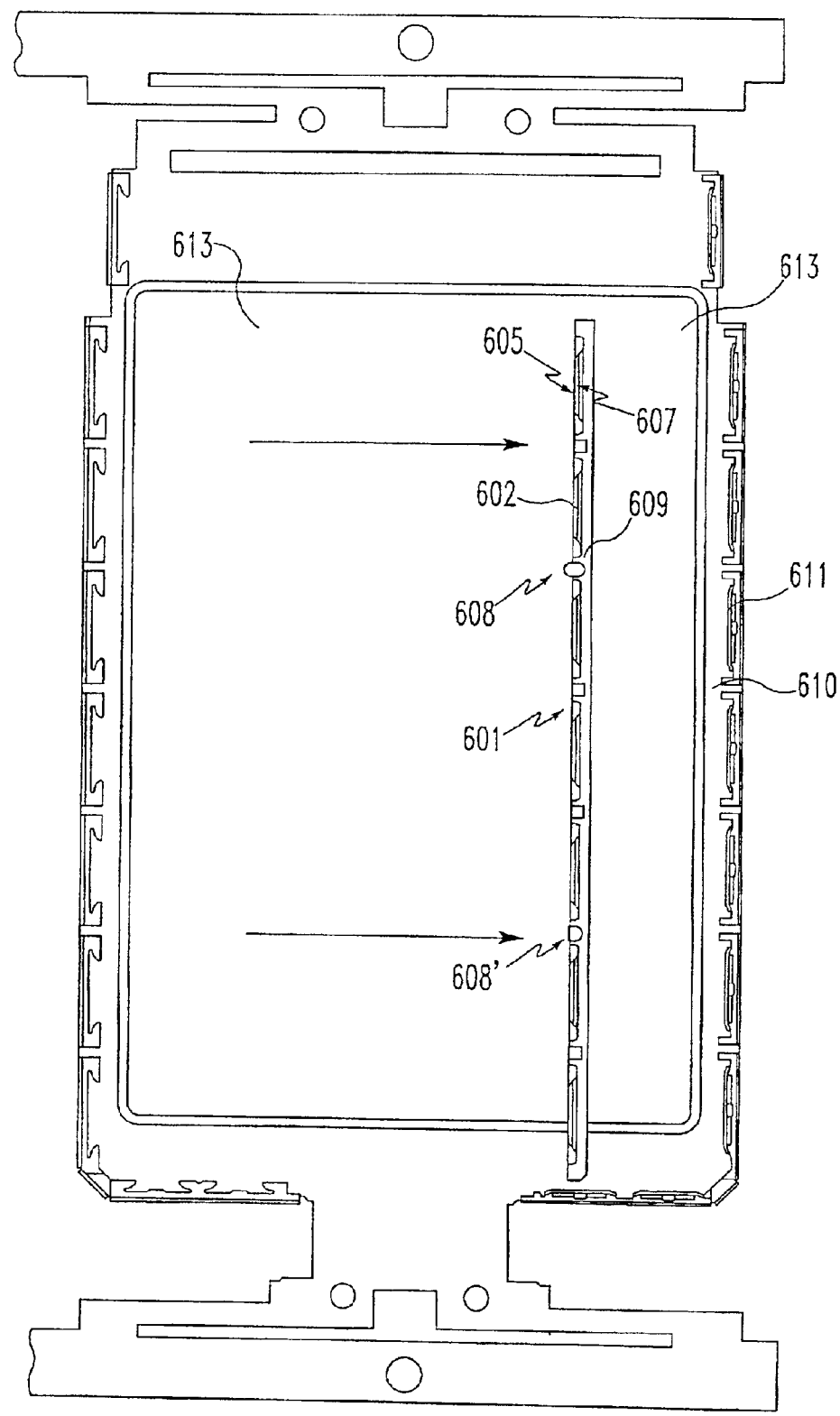

The embodiment includes the incorporation of a plastic bar which is attached to one side edge of the metal card shield as shown in FIG. 33. Since the frame-bar's attachment along the longitudinal direction in the card shield is a key subject, forthcoming discussion and diagrams are related to the combination. The same frame-bar is utilized in the top and bottom shields. FIG. 34 shows two different views (in addition to a 360 rotation of second view with respect to the first) of one such frame-bar 601 having several upstanding lobes 602 and two longitudinally separated upstanding pegs 603 towards its middle portion, while several tapered recessed areas 604 are distributed over its length. Each lobe has one vertical face 605 and a tapered face 607; this vertical face of all lobes form one integral vertical face as at 605 extending over the length of the frame-bar 601. The two pegs 603 and 603', each having a chamfered ledge 606, protrude away from the vertical face 605. This protrusion is along a semi-circular periphery 608 and 608', which both protrude from vertical face 605 in a space adjacent to the PCB edge. This protrusion towards the PCB is slightly different for these two pegs 603 and 603' due to a slight difference in their sizes and it faces the metal card shield edge 610. This is also the case for the tapered faces 607 as is further clear from FIG. 33 in which case 607 is opposite to the upstanding arcuate section 611 extending from the metal card 613 with several retaining latches 612 distributed over the length of shield edge 610.

Figure 44:
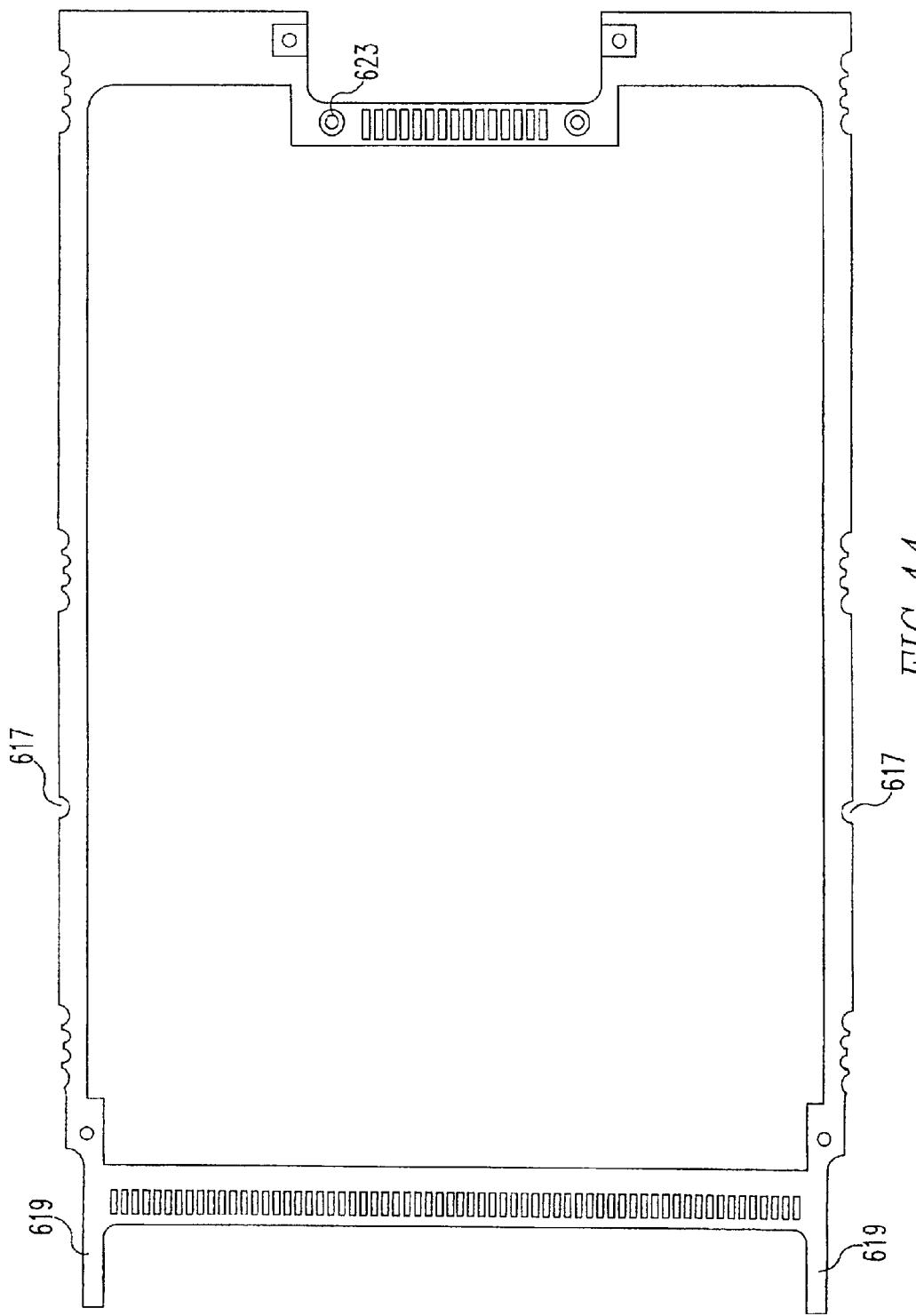
Figure 45:
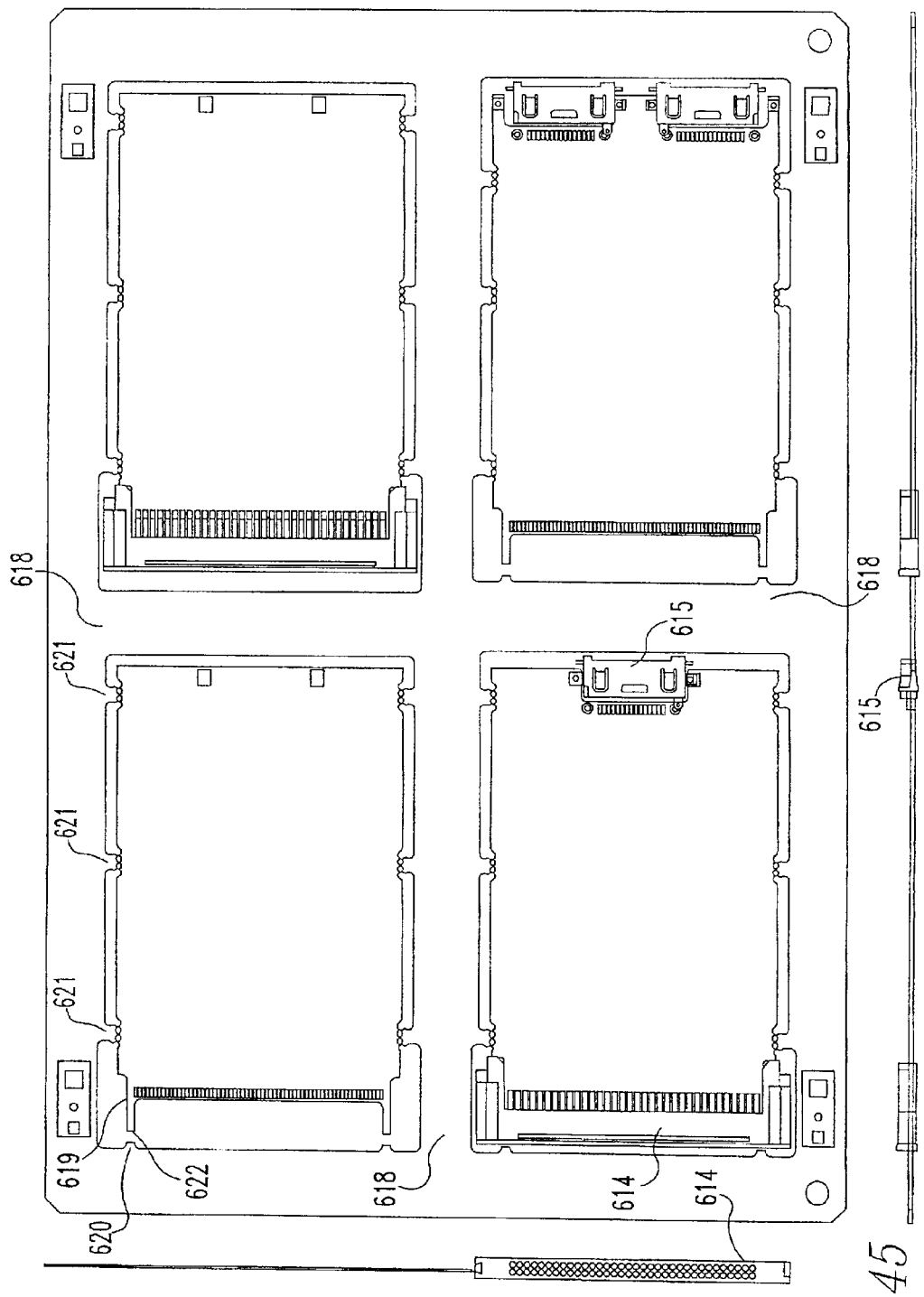
Figure 46:
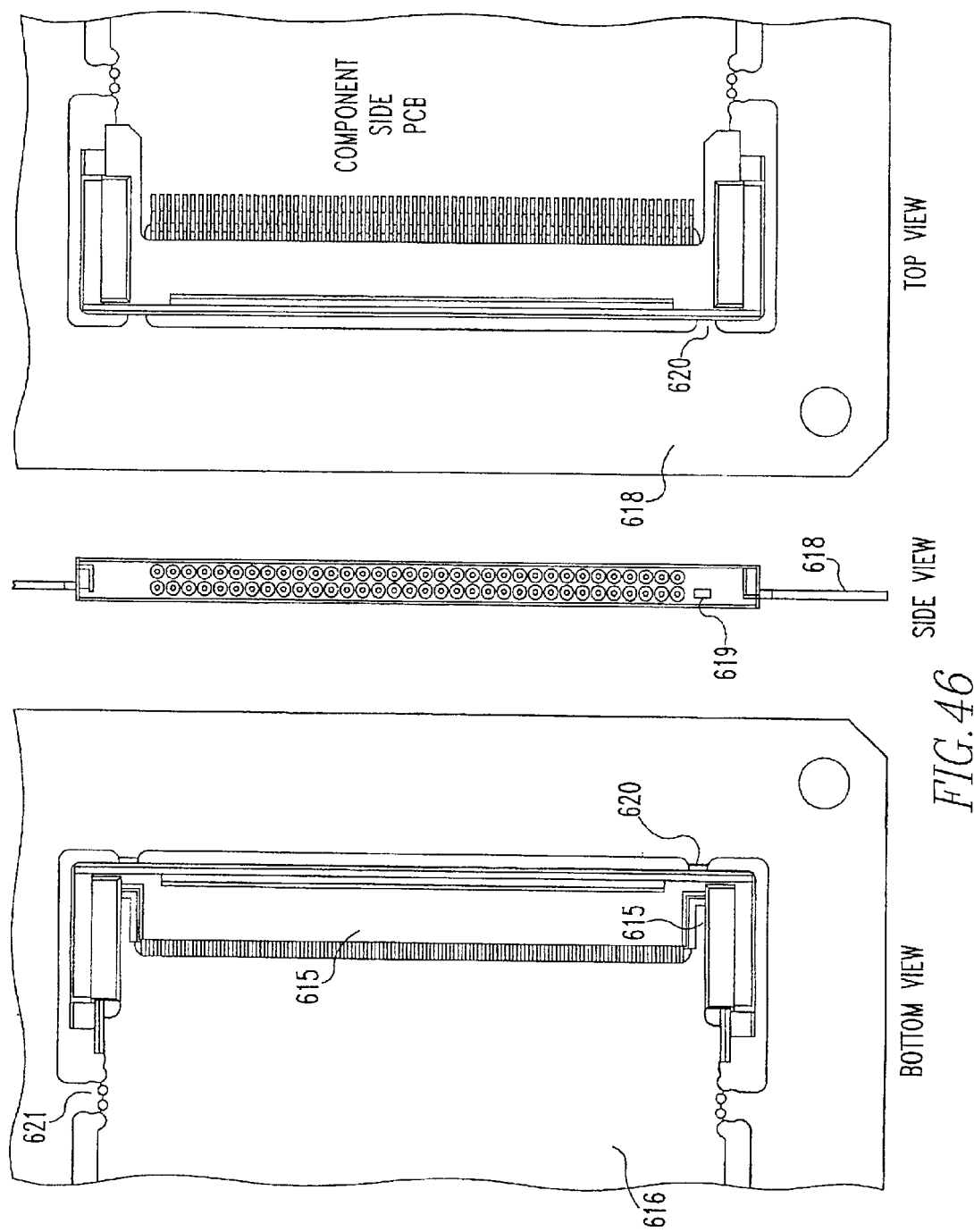
Figure 47:
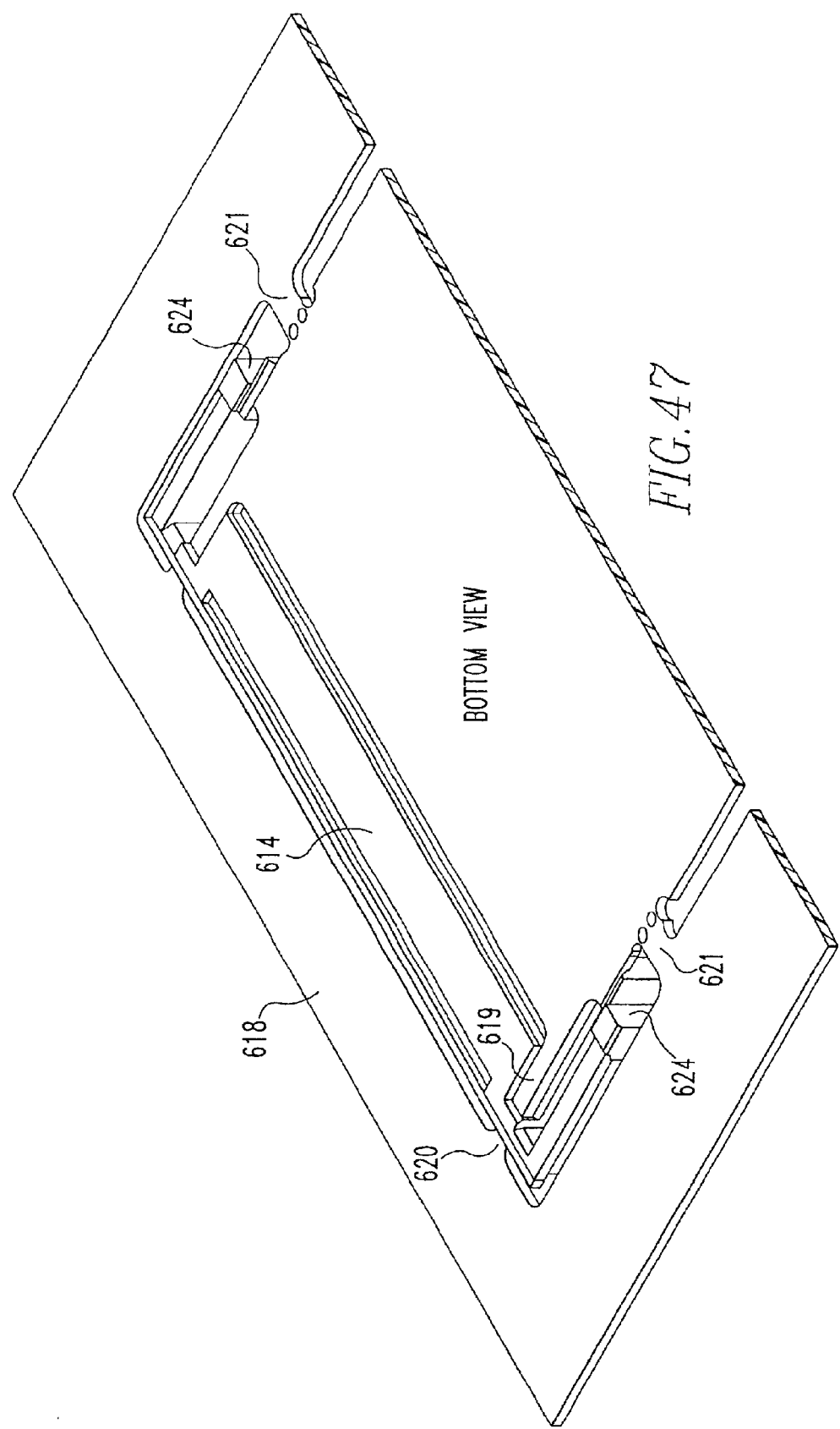
FIGS. 47–51 are perspective illustrating various parts of the card.
Figure 48:
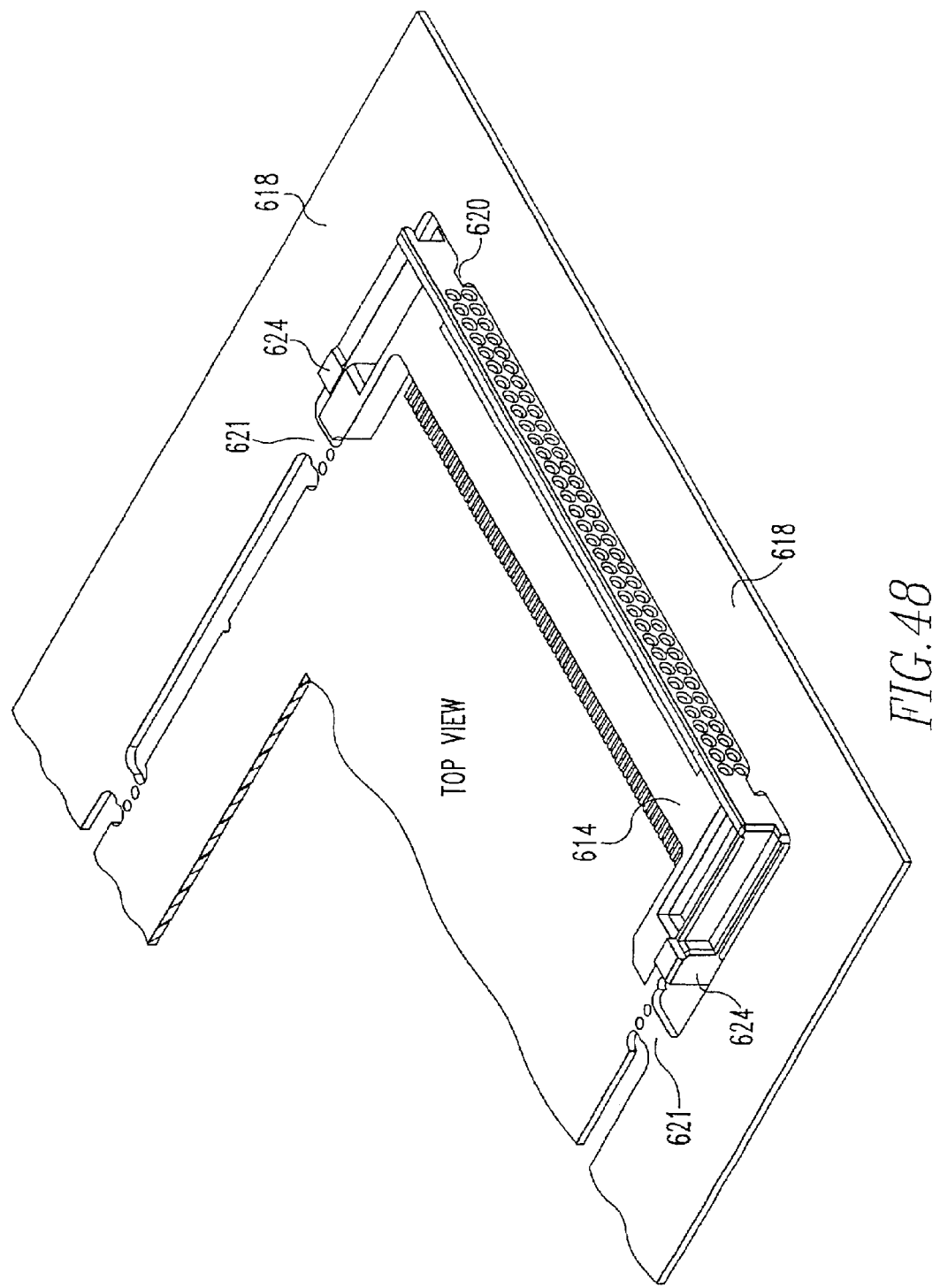

To understand the assembly of this frame-bar 601 on one edge of one metal card 613, the relative (process) positioning of the MTB connector 614 is effected by the use of steps 620 and tabs 619, using the concept of the panel 618, is emphasized. Corresponding perspective versions are shown in FIG. 47 and 48. In these figures the connector rear ends 604 immediately behind the coding keys, are defined. Now the I/O connector 615 can be located in holes 623, shown in FIG. 44 still using the frame structure as positioning means. Once all other electronic circuitry elements have been located on the PCB by the customer, a single reflow operation is used to form an integral electronic assembly, for example, a PCMCIA card. This assembly obviously includes the two end connectors. Finally, each electronic assembly can be separated from the frame by shearing-off in the vicinity of the joints 621. It is to be noted such a design foresees a means to accommodate also two I/O connectors, or no I/O connectors at all.

Figure 39:
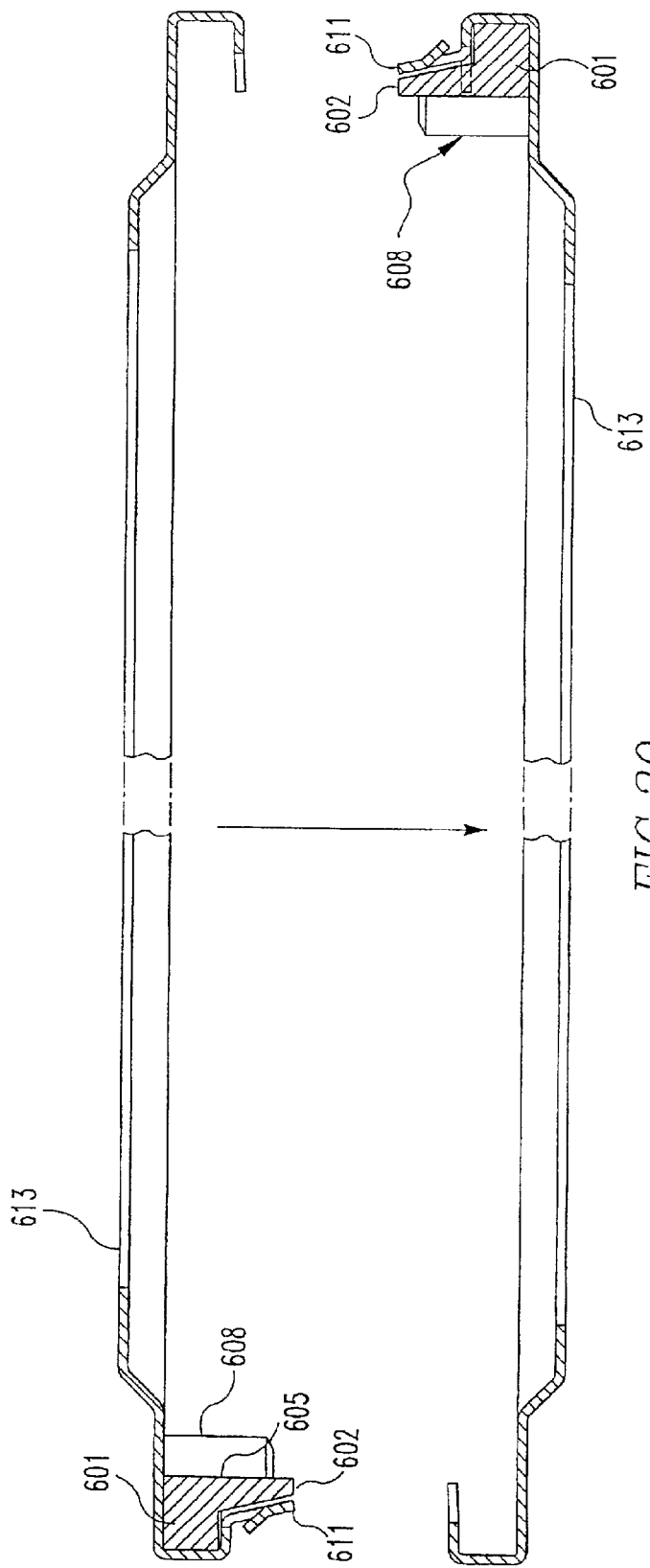
Figure 49:
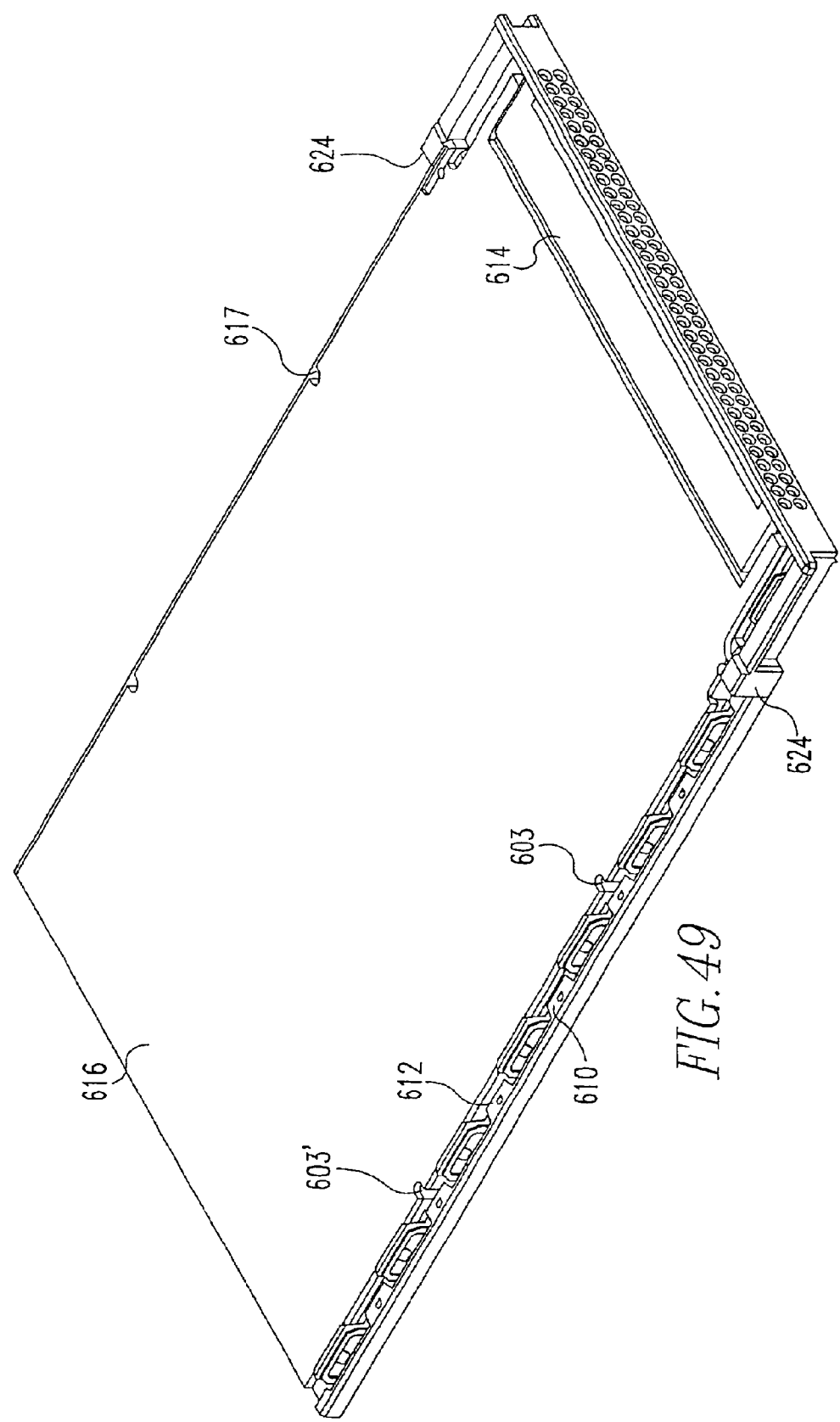
Figure 50:
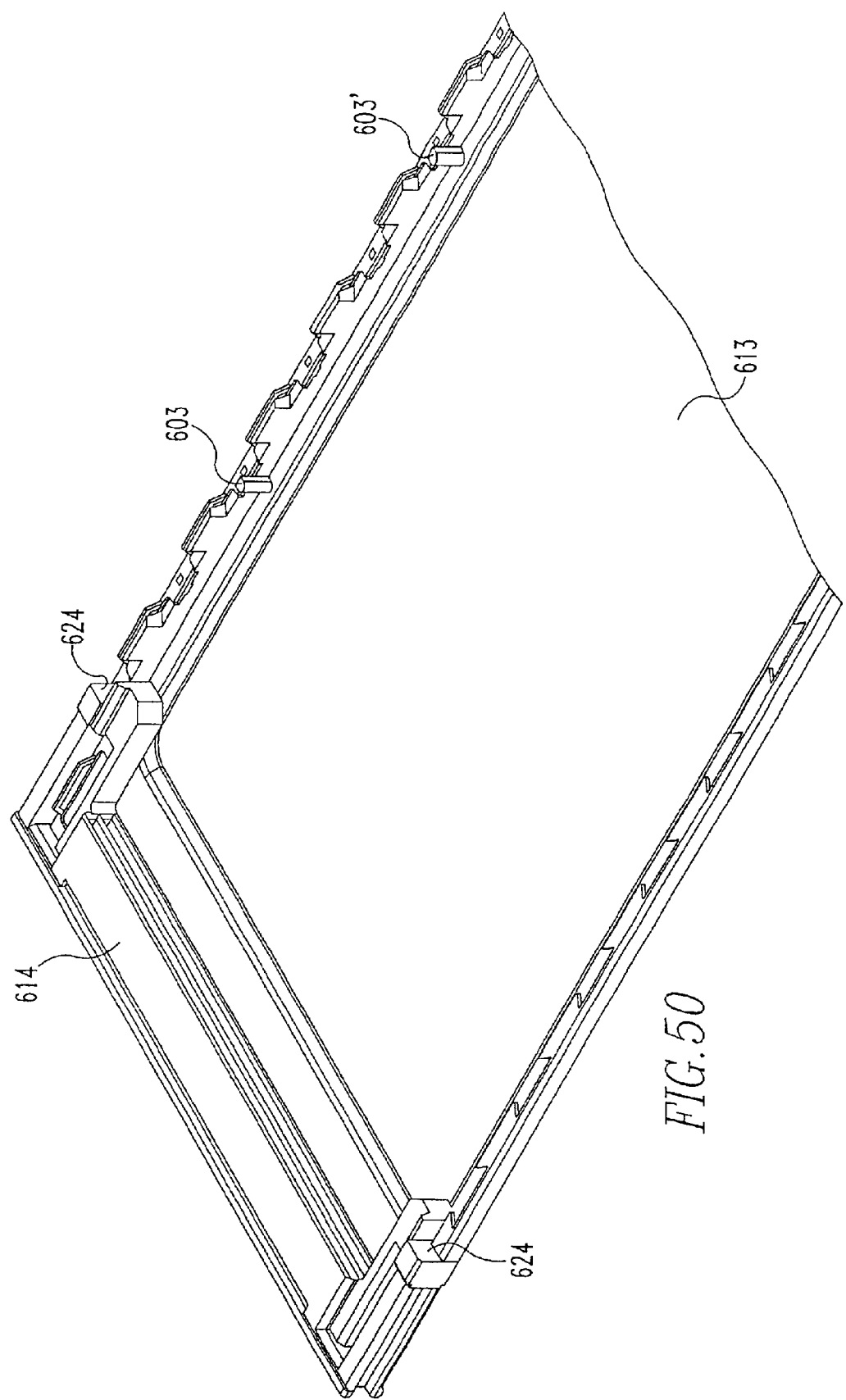
Figure 51:
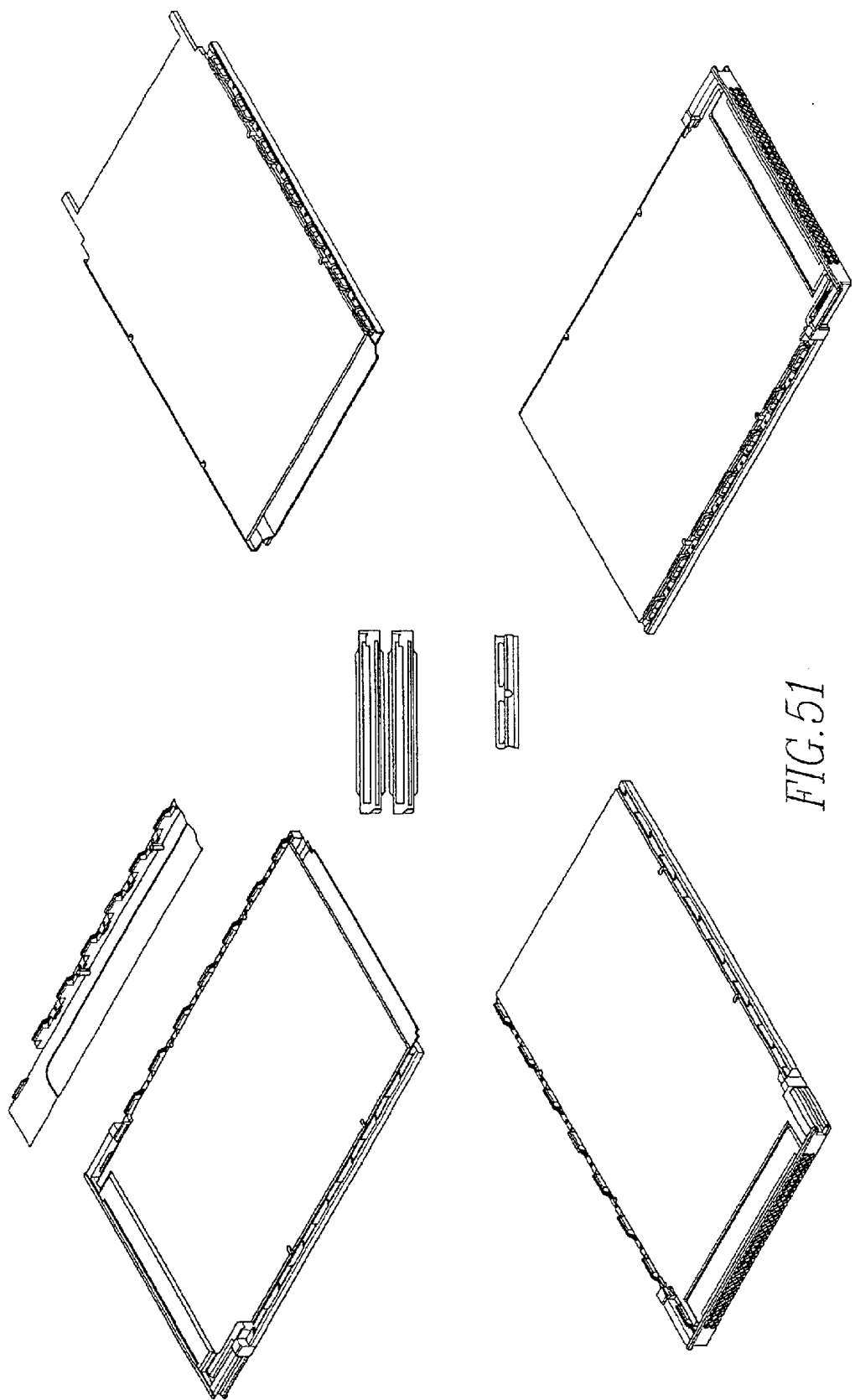
Figure 52:
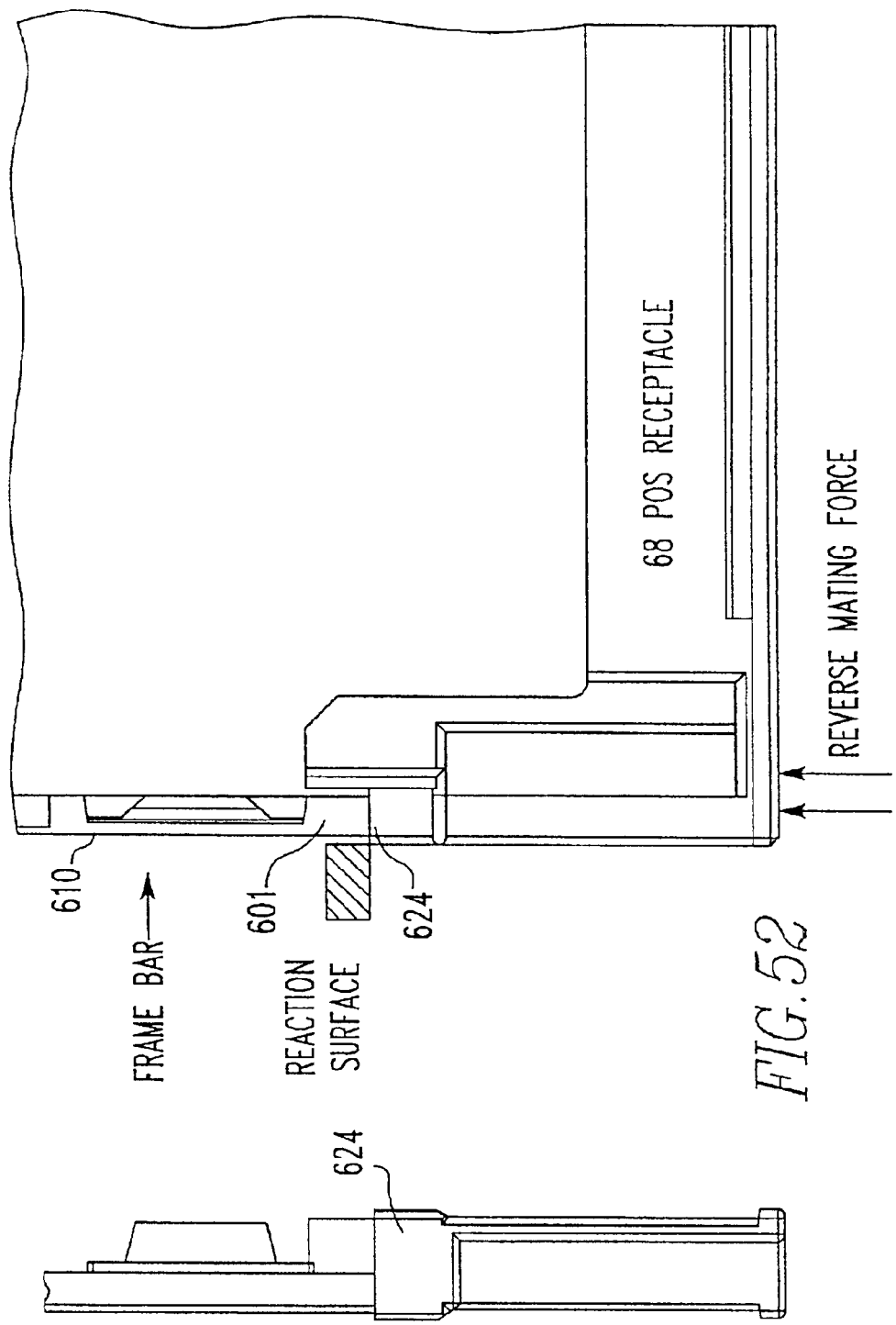
FIG. 52 is a side and top view of the frame support on the back of the coding key.
Figure 53C:
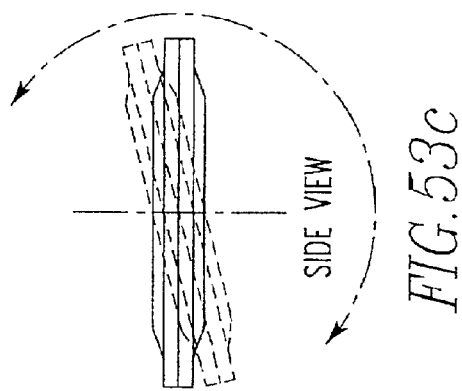
FIG. 53 is a schematic view illustrating a torque test of the card.
Figure 53A:
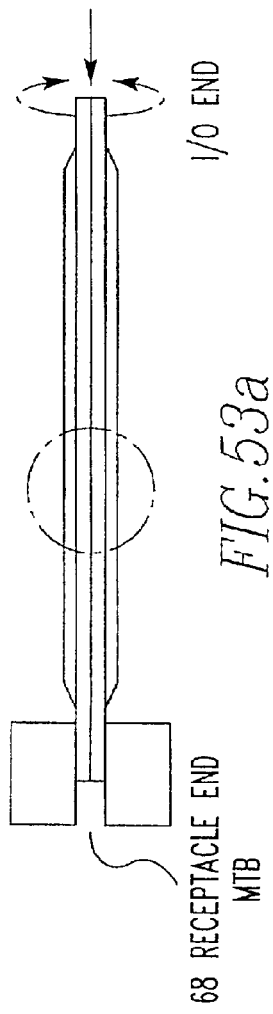
Figure 53B:
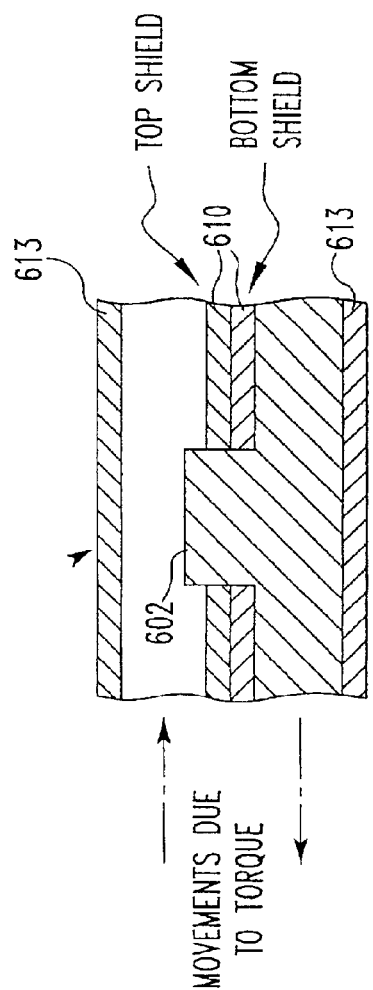

The user can locate such an assembly on a previously prepared combination of frame 201 with metal card 613. As shown in FIG. 49 (without an I/O connector), the pegs 603 and 603' allow for the fixation of this assembly, as discussed previously. Looking from the I/O to the MTB connector side, and assuming that the PCB and connector tails are transparent, results in FIG. 38. Different perspective views can be derived from FIG. 39.

Figure 40:
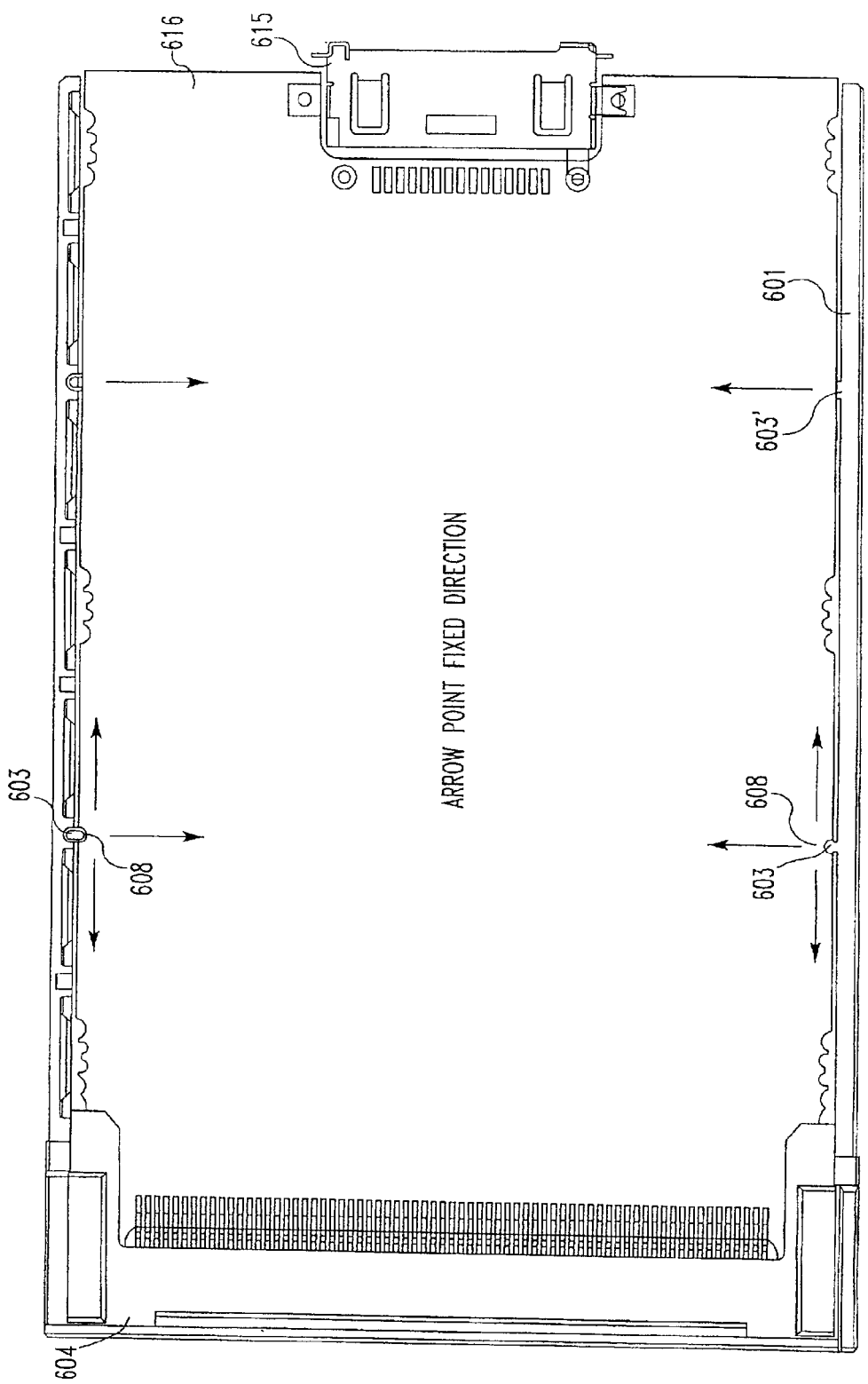
Figure 43:
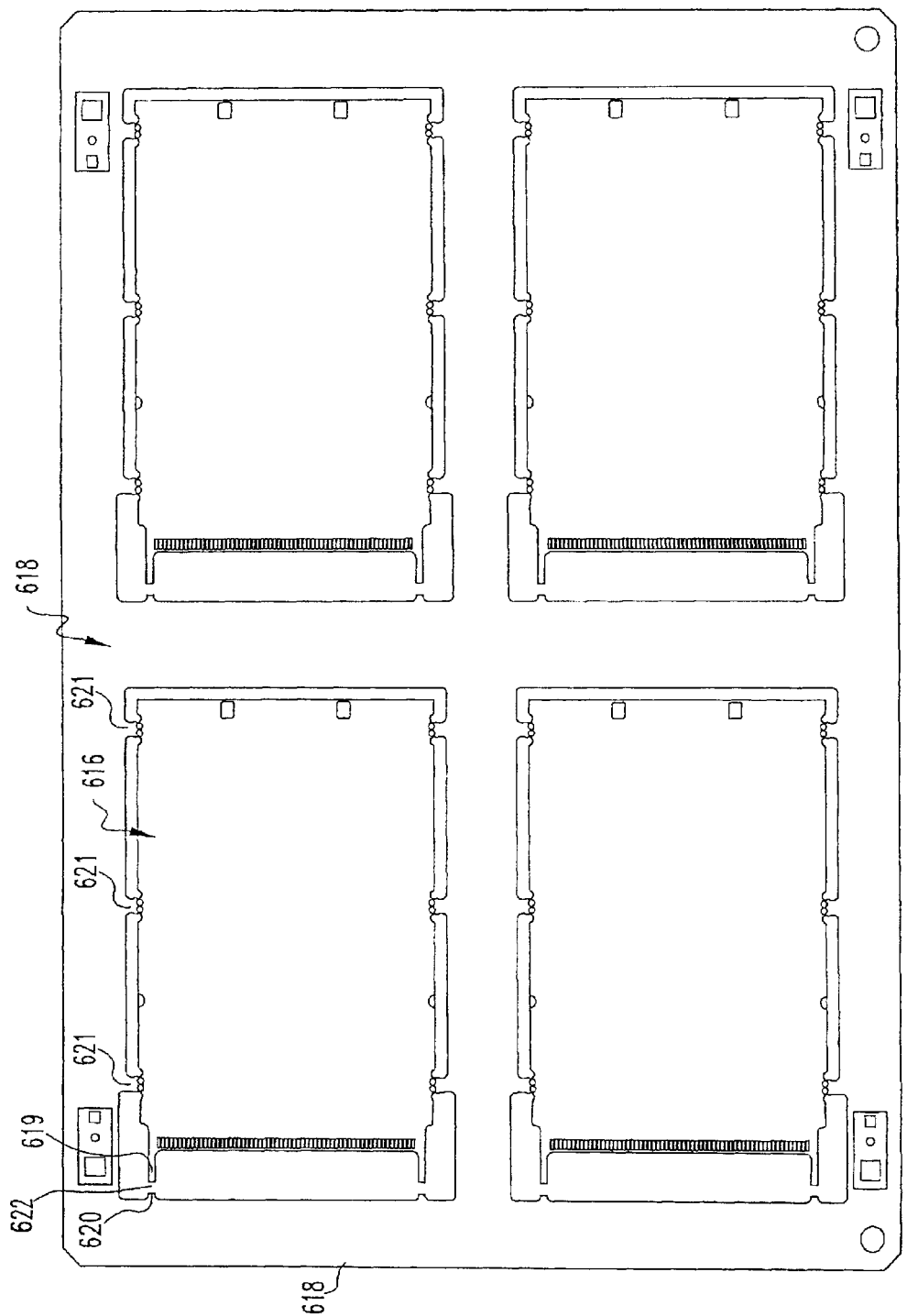
FIGS. 43–46 are various plan and edge views illustrating various parts of the card.

FIG. 40 shows another aspect of this design useful in "inverse" application of a card assembly. Due to the coding keys, such a card may be inserted only in one direction into the peripheral equipment. By inverted application (misuse), large longitudinal forces may be transmitted by the MTB connector to through the solder legs to the PCB 616. If the user continues to insert push the card from the I/O side, there may be a mechanical rupture to the solder joints on PCB, destroying the card. As evident in FIG. 40, the rear end 624 of the MTB connector in this design butts against the front of the frame 601. Since the latter is fixed in the case, such forces may be easily withstood by the edges of the PCB before force is transmitted to the solder connection. The current specification for PCMCIA cards is 60 Newton.

Another advantage of this design is its ability to withstand torque and twist, as demonstrated in FIG. 41. It needs to be understood that in this mode of mechanical loading, the upper and lower metal card constituting the PCMCIA assembly, have a tendency to move in opposite directions relative to each other. As the twist is being applied from the I/O end, the ensuing relative movement between the shields are effective at the MTB connector side. Consequently, the connection between the two card shields to the MTB connector ends, are subject to relatively large (shear) forces, which may easily rupture the joint. Since the peg lobes 602, shown in this figure as a cross-section over the total width of one lobe of the frame-bar 601, enter from opposite shield sides and locate in appropriate recesses in the shield edges 610, the relative longitudinal movements between the two shields are immobilized. Again, this immobilization mechanism is distributed on several locations, on both sides of the PCMCIA card (in the length direction). Many other designs are prone to failure in this mode of loading. This, therefore, is a significant advantage of this design. Thus the integration of the frame-bar gives a further enhancement of assembly robustness in addition to an extra safeguard (PCB alignment/ positioning and fixation) to the electronic circuitry contained within the case.

It will be appreciated that a card connector has been provided which allows for optimum shear strength and stiffness against bending and torsion.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

TABLE I

PCMCIA version 2

1. Torque test
¼ hard stainless steel, thickness 0.2 mm
Test conditions:
card kit consists of two shields plus two connectors, no PCB
applied torque is 1.236 (Nm)
torque is applied on the cards one time in each direction (instead of 5 times)
torque has been applied on the cards for about 10 seconds (instead of 5 minutes)
maximum torque is applied, even when maximum angle of 10° is exceeded
test has been performed before bend test (according to PCMCIA spec.) and finger nail test

| SAMPLE | TORQUE (Nm) | ROTATION ANGLE [°] | REMARKS |
|---|---|---|---|
| 1 | 1.236 | 11.3 | 2 CLOCKWISE |
| 1 | 1.236 | 12.6 | COUNTER-CLOCKWISE |
| 2 | 1.236 | 10.9 | CLOCKWISE |
| 2 | 1.236 | 11.7 | COUNTER-CLOCKWISE |
| AVERAGE | 1.236 | 11.63 | NO VISIBLE DAMAGES AT THE OUTSIDE |

CONCLUSIONS:
1. MAXIMUM ROTATION ANGLE OCCURRED WITHOUT MALFUNCTION
2. PCB OR OTHER ELEMENTS INSIDE THE CARD CAN FUNCTION AS A SPACER AND WILL INCREASE THE RIGIDITY SIGNIFICANTLY

TABLE II

PCMCIA version 2

2. Bend test
¼ hard stainless steel, thickness 0.2 mm
Test conditions:
card kit consists of two shields plus two connectors, no PCB
applied force is 19.6 (N)
test according to PCMCIA specification
clamping device is the gauge according to SK33279
cards are clamped quite firmly
test has been performed after torque test and before finger nail test
machine-settings: y-axis: F = 500 N, rate 1:1, range 5 mV/om (1 om = 2.5 N)
x-axis: L = 5, rate 1:1, range 5 mV/om (1 om = 1 mm)

| SAMPLE | FORCE (N) | DEFLECTION (mm) | REMARKS |
|---|---|---|---|
| 1 | 20.7 | 3.6 | I/O SIDE CLAMPED, UP |
| 1 | 20.2 | 3.3 | I/O SIDE CLAMPED, DOWN |
| 1 | 20.2 | 2.3 | 68 POS SIDE CLAMPED, UP |
| 1 | 20.5 | 4.0 | 68 POS SIDE CLAMPED, DOWN |
| 2 | 20.2 | 3.4 | I/O SIDE CLAMPED, UP |
| 2 | 20.1 | 3.4 | I/O SIDE CLAMPED, DOWN |
| 2 | 20.6 | 3.1 | 68 POS SIDE CLAMPED, UP |
| 2 | 20.4 | 2.9 | 68 POS SIDE CLAMPED, DOWN |
| average I/O | 20.30 | 3.43 | |
| average 68 | 20.43 | 3.08 | |

CONCLUSIONS:
1. THE VERSION 2 CARD KIT IS VERY STIFF RELATIVE TO THE PRIOR ART
2. NO DIFFERENCE IN DEFLECTION BETWEEN I/O SIDE AND 68 POSITION SIDE BY OPTIMIZED GEOMETRY AND CLAMPING MORE FIRMLY

TABLE III

PCMCIA version 2

| | FORCE (N) | | DESPLACEMENT (mm) | REMARKS |
|---|---|---|---|---|
| SAMPLE 1 | | | | |
| 1 | 145 | 20 | 2.08 | 103 |
| 2 | 120 | 24 | 1.72 | 14 |
| 3 | 165 | 33 | 2.24 | 112 |
| I/O4 | 120 | 24 | 0.42 | 21 |
| I/O5 | 90 | 10 | 0.25 | 125 |
| 6 | 113 | 23.9 | 1.66 | 83 |
| 7 | 130 | 26 | 1.44 | 72 |
| 8 | 95 | 10 | 1.18 | 39 |
| average | 127.92 | | 1.72 | |
| average I/O | 105.00 | | 0.34 | |
| SAMPLE 2 | | | | |
| 1 | 105 | 21 | 1.68 | 84 |
| 2 | 95 | 19 | 1.34 | 67 |
| 3. | 165 | 83 | 1.94 | 97 |
| I/O4 | 110 | 22 | 0.30 | 15 |
| I/O5 | 95 | 10 | 0.28 | 14 |
| 6 | 110 | 22 | 1.36 | 68 |
| 7 | 120 | 24 | 1.24 | 62 |
| 8 | 115 | 23 | 1.26 | 63 |
| average | 118.33 | | 1.47 | |
| average I/O | 102.50 | | 0.29 | |
| long sides | 123.13 | | 1.59 | average value over two samples |
| I/O side | 103.75 | | 0.31 | average value over two samples no visible damages at the outside |

3. Finger nail simulation tests
¼ hard stainless steel, thickness 0.2 mm
The test kits have been approved by several people concerning the resistance against breaking open the kit by hand (including using your finger nails)
Test conditions:
card kit consists of two shields plus two connectors, no PCB
card kit is clamped up to 14 mm from the sides
test pin according to drawing SK35578 revision 1
grease is applied on the card kit and test pin to avoid stick-slip phenomenon
test has been performed after respectively torque and bend test
machine-settings: Y-axis: F = 100 N, rate 1:1, range 0.1 V/om(1cm = 50 N)
X-axis: L = 50, rate 5:1, range 5 mV/cm (1 om = 0.2 mm)
CONCLUSIONS:
1. the forces to open the kit are quite high
2. the force at the I/O side is almost as high as at the long sides
3. the penetration depth at the I/O side is much lower than at the long sides
4. the force/displacement curves are reproducible

What is claimed is:
1. In an electronic card assembly, wherein the improvement comprises said electronic card assembly withstanding a rotating angle of greater than approximately 10° during a torque test which applies a torque of greater than approximately 1.2N-m, and wherein the electronic card assembly does not include a printed circuit board during the torque test.
2. The electronic card assembly according to claim 1, wherein said electronic card assembly can withstand a rotating angle of approximately 12°.
3. The electronic card assembly according to claim 1, wherein during the torque test the torque is applied at least one time in a clockwise.
4. The electronic card assembly according to claim 1, wherein during the torque test the torque is applied at least one time in a counter-clockwise direction.
5. The electronic card assembly according to claim 1, wherein during the torque test the torque is applied for at least ten seconds.

6. The electronic card assembly according to claim 1, wherein during the torque test the torque is applied for at least five minutes.

7. The electronic card assembly according to claim 1, wherein the electronic card assembly comprises stainless steel having a thickness of 0.2 millimeters.

8. The electronic card assembly according to claim 1, wherein during the electronic card assembly comprises two shields and two connectors.

* * * * *